United States Patent
Wang et al.

(10) Patent No.: US 11,222,766 B2
(45) Date of Patent: Jan. 11, 2022

(54) MULTI-CELL DETECTOR FOR CHARGED PARTICLES

(71) Applicant: ASML Netherlands B.V., Veldhoven (NL)

(72) Inventors: Joe Wang, Campbell, CA (US); Yongxin Wang, San Ramon, CA (US); Zhong-Wei Chen, San Jose, CA (US); Xuerang Hu, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/652,398

(22) PCT Filed: Sep. 28, 2018

(86) PCT No.: PCT/EP2018/076477
§ 371 (c)(1),
(2) Date: Mar. 30, 2020

(87) PCT Pub. No.: WO2019/063794
PCT Pub. Date: Apr. 4, 2019

(65) Prior Publication Data
US 2020/0286708 A1    Sep. 10, 2020

Related U.S. Application Data

(60) Provisional application No. 62/566,102, filed on Sep. 29, 2017.

(51) Int. Cl.
*H01J 37/244* (2006.01)
*H01J 37/28* (2006.01)

(52) U.S. Cl.
CPC ............ *H01J 37/244* (2013.01); *H01J 37/28* (2013.01); *H01J 2237/04756* (2013.01); *H01J 2237/2441* (2013.01)

(58) Field of Classification Search
CPC .. H01J 37/28; H01J 37/244; H01J 2237/2441; H01J 2237/24465;
(Continued)

(56) References Cited

U.S. PATENT DOCUMENTS

| 4,588,891 | A | * | 5/1986 | Saito | ...................... H01J 37/28 |
| | | | | | 250/310 |
| 4,604,523 | A | * | 8/1986 | Knowles | ................ B82Y 15/00 |
| | | | | | 250/310 |

(Continued)

FOREIGN PATENT DOCUMENTS

| CN | 102130218 A | 7/2011 |
| JP | 2009-105037 | 5/2009 |

(Continued)

OTHER PUBLICATIONS

International Search Report and Written Opinion issued in related PCT International Application No. PCT/EP2018/076477, dated Mar. 1, 2019 (14 pgs.).

(Continued)

*Primary Examiner* — David A Vanore
(74) *Attorney, Agent, or Firm* — Finnegan, Henderson, Farabow, Garrett & Dunner, LLP

(57) ABSTRACT

A multi-cell detector may include a first layer having a region of a first conductivity type and a second layer including a plurality of regions of a second conductivity type. The second layer may also include one or more regions of the first conductivity type. The plurality of regions of the second conductivity type may be partitioned from one another by the one or more regions of the first conductivity type of the second layer. The plurality of regions of the second conductivity type may be spaced apart from one or more regions of the first conductivity type in the second (Continued)

layer. The detector may further include an intrinsic layer between the first and second layers.

15 Claims, 20 Drawing Sheets

(58) Field of Classification Search
    CPC .......... H01J 2237/2448; H01J 2237/22; H01J 2237/221; H01J 2237/2444; H01J 2237/24475; H01J 2237/2449; H01J 2237/24507; H01J 2237/24578; H01J 2237/24592; H01J 2237/2485; H01J 2237/2605; H01J 2237/28; H01J 2237/2817; H01J 31/26; H01J 37/222; H01J 37/265
    USPC ....... 250/310, 397, 307, 396 R, 472.1, 488.1
    See application file for complete search history.

(56) References Cited

U.S. PATENT DOCUMENTS

| | | | |
|---|---|---|---|
| 4,897,545 A * | 1/1990 | Danilatos | H01J 37/244 250/310 |
| 4,990,778 A * | 2/1991 | Norioka | H01J 37/222 250/310 |
| 5,834,774 A * | 11/1998 | Negishi | H01J 37/28 250/310 |
| 7,714,300 B1 * | 5/2010 | McCord | H01J 37/28 250/397 |
| 9,331,117 B2 * | 5/2016 | Nihtianov | G03F 7/70558 |
| 9,726,768 B2 * | 8/2017 | Friedman | A61N 5/1075 |
| 10,197,501 B2 * | 2/2019 | Chuang | G01N 21/88 |
| 10,418,496 B2 * | 9/2019 | Yamanaka | H01L 31/022408 |
| 2005/0133838 A1 * | 6/2005 | Son | H01L 31/105 257/292 |
| 2006/0219906 A1 * | 10/2006 | Langer | G01N 23/2251 250/310 |
| 2011/0169116 A1 * | 7/2011 | Nanver | H01L 31/022408 257/429 |
| 2012/0298864 A1 * | 11/2012 | Morishita | H01J 49/067 250/310 |

FOREIGN PATENT DOCUMENTS

| | | |
|---|---|---|
| JP | 2011-017722 | 1/2011 |
| JP | 2011-145292 | 7/2011 |
| KR | 10-2005-0060856 A | 6/2005 |
| TW | 372367 B | 10/1999 |
| TW | 201411681 A | 3/2014 |
| WO | WO 2006/009444 A2 | 1/2006 |
| WO | WO 2012/021652 A2 | 2/2012 |

OTHER PUBLICATIONS

Notice of Reasons for Rejection issued in related Japanese Patent Application No. 2020-515710; dated Jun. 1, 2021 (14 pgs.).
Notification of Reason(s) for Refusal issued in related Korean Patent Application No. 10-2020-7008949; dated Aug. 24, 2021 (12 pgs.).

* cited by examiner

MULTI-CELL DETECTOR FOR CHARGED PARTICLES

CROSS-REFERENCE TO RELATED APPLICATIONS

This application is a national stage filing under 35 U.S.C. § 371 of International Application No. PCT/EP2018/076477, filed on Sep. 28, 2018, and published as WO 2019/063794 A1, which claims priority of U.S. Provisional Application No. 62/566,102, which was filed on Sep. 29, 2017. The contents of these applications are incorporated herein by reference in their entireties.

TECHNICAL FIELD

The present disclosure generally relates to charged particle detection, and more particularly, to a multi-cell detector of charged particles and systems, methods, and apparatuses based on the same.

BACKGROUND

Detectors are used in various fields for sensing physically observable phenomena. For example, electron microscopes are useful tools for observing the surface topography and composition of a sample. A charged particle (e.g., electron) beam microscope, such as a scanning electron microscope (SEM), capable of resolution down to less than one nanometer, may serve as a practical tool for inspecting integrated circuit (IC) components having a feature size of, for example, sub-100 nanometers. Such a charged particle beam tool may comprise a detector that receives charged particles projected from a sample, and that outputs a detection signal. After hitting a sample, secondary electrons, backscattered electrons, auger electrons, x-rays, visible light, etc. may be emitted. The emitted energy may form a beam incident on the detector. Detection signals may be used to reconstruct images of a sample and may be used, for example, to reveal defects in the sample.

In some applications, there may be one or more beams incident on a detector. For example, with a multi-beam SEM, a plurality of primary electron beams may be used to simultaneously scan different areas of a wafer under inspection. The wafer, after receiving the primary electron beams, may emit secondary electrons that are directed toward a detector. The intensity of the secondary electrons may vary based on the properties of the internal or external structures of the wafer. As such, the secondary electrons may be detected and analyzed to determine various features of the internal or external structures of the wafer and may be used to reveal any defects that may exist in the wafer.

However, electrons from adjacent beams emitted from the sample may be directed to reach substantially the same location of the detector surface. As a result, beam spots formed by adjacent electron beams may become very close to one another, and in some cases may partially overlap, leading to crosstalk. The effects of crosstalk may be added to the output signals of the electron detector as noise. Thus, output signals of the electron detector may include noise components that do not correlate with a particular sample structure under inspection, and the fidelity of image reconstruction may be degraded.

To ensure accurate inspection, the multi-beam SEM should be able to distinguish secondary electrons generated by different primary electron beams. In existing systems, a detector may be provided that includes a plurality of discrete electron sensing elements. For example, a detector array may be provided with sensing elements that are physically spaced apart from one another. Each of the plurality of primary electron beams may have a corresponding electron sensing element in the detector array. A deflector array may also be used to deflect secondary electrons generated by different primary electron beams to their corresponding electron sensing elements. As such, the deflector array may provide a different deflection direction (or angle) for each electron sensing element. However, if the multi-beam SEM needs to use a large number of primary electron beams and thus electron sensing elements, there is often a shortage of different deflection directions that may be provided by the deflector array. Although the deflector array can be expanded to provide more deflection direction, this not only adds structural complexity to the deflector array, but also increases the difficulty of aligning the detector array with the electron sensing elements.

SUMMARY

Embodiments of the present disclosure relate to a multi-cell detector used that may be used in a multi-beam inspection system. In some embodiments, a detector is provided. The detector may include a first layer including a first region of a first conductivity type. The detector may also include a second layer including a plurality of second regions of a second conductivity type and one or more third regions of the first conductivity type. The plurality of second regions of the second conductivity type may be partitioned from each other by the one or more third regions of the first conductivity type of the second layer. The plurality of second regions of the second conductivity type may be spaced apart from and may not physically contact with the one or more third regions of the first conductivity type in the second layer. The detector may further include an intrinsic layer between the first and second layers.

In some embodiments, a charged particle beam apparatus is provided. The charged particle beam apparatus may be provided as a part of a charged particle beam system. The apparatus may include a charged particle source configured to generate one or more beams of charged particles that may be projected on a surface of a sample and may cause the sample to generate secondary charged particles. The apparatus may also include a detector comprising: a first layer including a first region of a first conductivity type, a second layer including a plurality of second regions of a second conductivity type, and an intrinsic region between the first layer and the second layer. The plurality of second regions may be partitioned from one another. Furthermore, the plurality of second regions may be configured to output electrical signals based on received charged particles. The apparatus may further include an amplifier configured to amplify the electrical signals outputted by the plurality of second regions and forward the amplified electrical signals to a controller. The controller may include a data processing system.

In some embodiments, a method is provided. The method may include applying a first bias to a first region of a first conductivity type of a first layer of a detector and applying a second bias to a plurality of second regions of a second layer of the detector. The detector may include an intrinsic region between the first layer and the second layer. The plurality of second regions in the detector may be partitioned from one another by one or more partition regions. The method may also include receiving an output signal from the second layer and determining a charged particle signal based on the received output signal.

Additional objects and advantages of the disclosed embodiments will be set forth in part in the following description, and in part will be apparent from the description, or may be learned by practice of the embodiments. The objects and advantages of the disclosed embodiments may be realized and attained by the elements and combinations set forth in the claims.

It is to be understood that both the foregoing general description and the following detailed description are exemplary and explanatory only and are not restrictive of the disclosed embodiments, as claimed.

BRIEF DESCRIPTION OF THE DRAWINGS

The above and other aspects of the present disclosure will become more apparent from the description of exemplary embodiments, taken in conjunction with the accompanying drawings in which.

DESCRIPTION OF THE EMBODIMENTS

Figure 1:
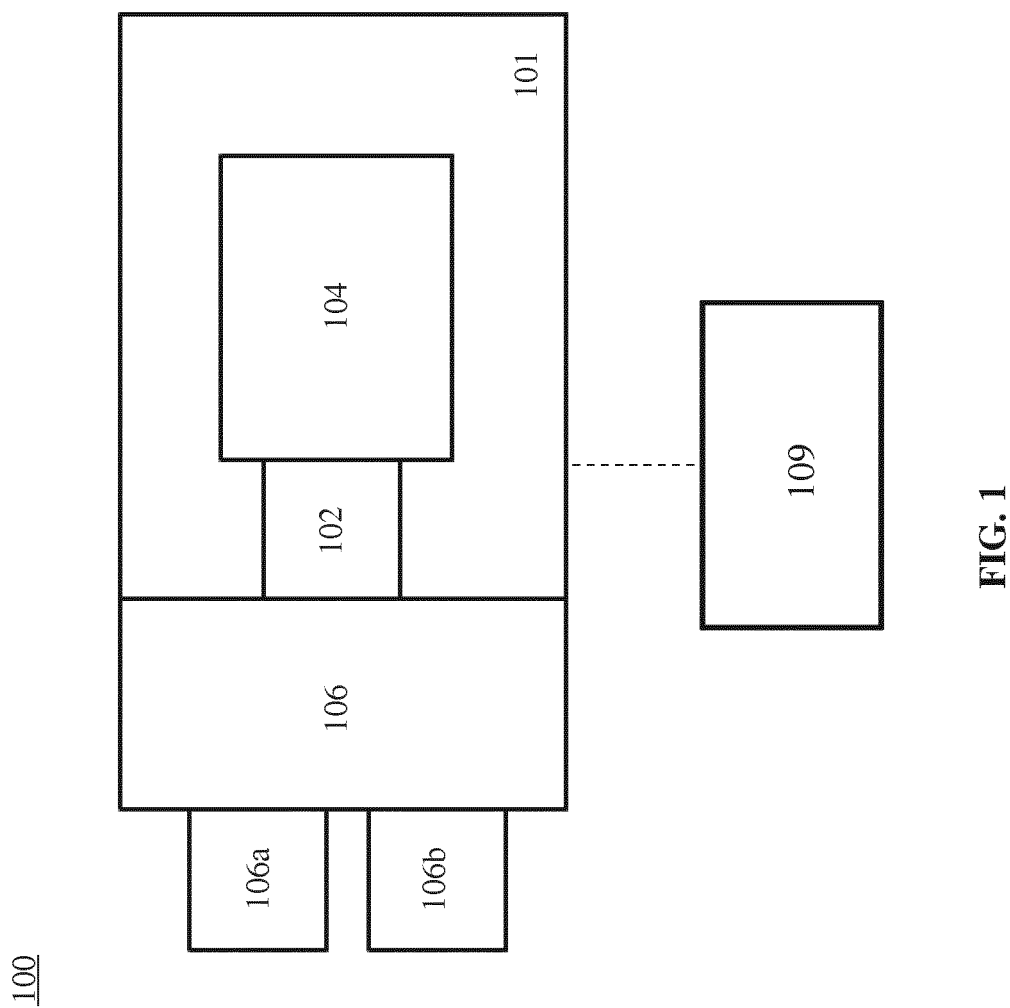
FIG. 1 is a schematic diagram illustrating an exemplary electron-beam inspection (EBI) system, consistent with embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the subject matter disclosed. Instead, they are merely examples of apparatuses, systems, and methods consistent with aspects related to the subject matter as recited in the appended claims. For example, although some embodiments are described in the context of systems utilizing electron beams, the disclosure is not so limited. Other types of charged particle beams may be similarly applied. Furthermore, apparatuses, systems, and methods for detection may be used in other imaging systems, such as optical imaging, photo detection, x-ray detection, ion detection, etc.

Aspects of the present application relate to a multi-cell detector that may be useful in an inspection tool, such as a scanning electron microscope (SEM). Inspection tools may be used in the manufacturing process of integrated circuit (IC) components. To realize the enhanced computing power of modern day electronic devices, the physical size of the devices may shrink while the packing density of circuit components, such as, transistors, capacitors, diodes, etc., is significantly increased on an IC chip. For example, in a smart phone, an IC chip (which may be the size of a thumbnail) may include over 2 billion transistors, the size of each transistor being less than $\frac{1}{1000}$th of a human hair. Not surprisingly, semiconductor IC manufacturing is a complex process, with hundreds of individual steps. Errors in even one step have the potential to dramatically affect the functioning of the final product. Even one "killer defect" can cause device failure. The goal of the manufacturing process is to improve the overall yield of the process. For example, for a 50-step process to get 75% yield, each individual step must have a yield greater than 99.4%, and if the individual step yield is 95%, the overall process yield drops to 7%.

It is increasingly important to ensure the ability to detect defects with high accuracy and high resolution while maintaining high throughput (defined as the number of wafer processes per hour, for example). High process yields and high wafer throughput may be impacted by the presence of defects, especially when operator intervention is involved. Thus, detection and identification of micro and nano-sized defects by inspection tools (such as a SEM) is important for maintaining high yields and low cost.

In some inspection tools, a sample may be inspected by scanning a beam of high energy electrons over the sample surface. Due to interactions at the sample surface, secondary electrons may be generated from the sample that are then detected by a detector. To increase throughput, some inspection tools may employ multiple electron beams that are scanned over different regions of the sample surface simultaneously, thus generating multiple secondary electron beams directed toward the detector. To capture these multiple secondary electron beams for analysis simultaneously, a multi-cell detector may be provided so that each secondary electron beam lands in its own detection cell. Therefore, electrons originated from different electron beams may enter different detection cells so that signals corresponding to each electron beam may be separately analyzed.

In some application, it may be desirable to segregate electrons arriving at a detector so that electrons from different beams do not interfere with one another. Such interference may contribute to "cross talk" and may have undesirable effects on output signal, such as increased noise. Thus, output signals of a detector may include noise components that do not correlate with a particular sample structure under inspection, and the fidelity of image reconstruction may be degraded.

When electrons reach the front surface of the detector, they may interact with various layers in the detector. For example, electrons may pass through a top surface aluminum layer and may interact with a semiconductor region. However, such interactions may not be well controlled. For example, electrons may be scattered in random directions. Due to interactions with one or more semiconductor regions, electrons may not necessarily travel straight down through the medium of a detector. By the time the electrons reach the opposite side of the detector, electrons from different electron beams may end up at the same location. Thus, even if a detector is physically divided into a plurality of discrete detector cells, electrons from different electron beams may not be properly segregated into different detector cells.

In some aspects of the disclosure, a detector may include a continuous semiconductor region. The region may be a diode that includes p-type and n-type semiconductor layers. The diode may be biased so that attractive fields are formed within the diode. Such fields may help to guide electrons to appropriate sections of the detector. Therefore, electrons from different electron beams may be directed to output sections of corresponding detector cells, and effects of cross talk may be reduced.

As used herein, unless specifically stated otherwise, the term "or" encompasses all possible combinations, except where infeasible. For example, if it is stated that a database can include A or B, then, unless specifically stated otherwise or infeasible, the database can include A, or B, or A and B. As a second example, if it is stated that a database can include A, B, or C, then, unless specifically stated otherwise or infeasible, the database can include A, or B, or C, or A and B, or A and C, or B and C, or A and B and C.

FIG. 1 is a schematic diagram illustrating an exemplary electron-beam inspection (EBI) system 100 that may include a detector, consistent with embodiments of the present disclosure. EBI system 100 may be used for charged particle imaging. As shown in FIG. 1, EBI system 100 includes a main chamber 101, a load/lock chamber 102, an electron-beam (e-beam) tool 104, and an equipment front end module (EFEM) 106. E-beam tool 104 is located within main chamber 101.

EFEM 106 includes a first loading port 106a and a second loading port 106b. EFEM 106 may include additional loading port(s). First loading port 106a and second loading port 106b may receive wafer front opening unified pods (FOUPs) that contain wafers (e.g., semiconductor wafers or wafers made of other material(s)) or samples to be inspected (wafers and samples may be collectively referred to as "wafers"). One or more robotic arms (not shown) in EFEM 106 may transport wafers to load/lock chamber 102.

Load/lock chamber 102 is connected to a load/lock vacuum pump system (not shown), which removes gas molecules in load/lock chamber 102 to reach a first pressure below the atmospheric pressure. After reaching the first pressure, one or more robotic arms (not shown) may transport the wafer from load/lock chamber 102 to main chamber 101. Main chamber 101 is connected to a main chamber vacuum pump system (not shown), which removes gas molecules in main chamber 101 to reach a second pressure below the first pressure. After reaching the second pressure, the wafer is subject to inspection by e-beam tool 104. Electron beam tool 104 may be a single-beam system or a multi-beam system. A controller 109 is electrically connected to e-beam tool 104. Controller 109 may be a computer configured to execute various controls of EBI system 100. While controller 109 is shown in FIG. 1 as being outside of the structure that includes main chamber 101, load/lock chamber 102, and EEFM 106, it is appreciated that controller 109 may be part of the structure.

Figure 2:
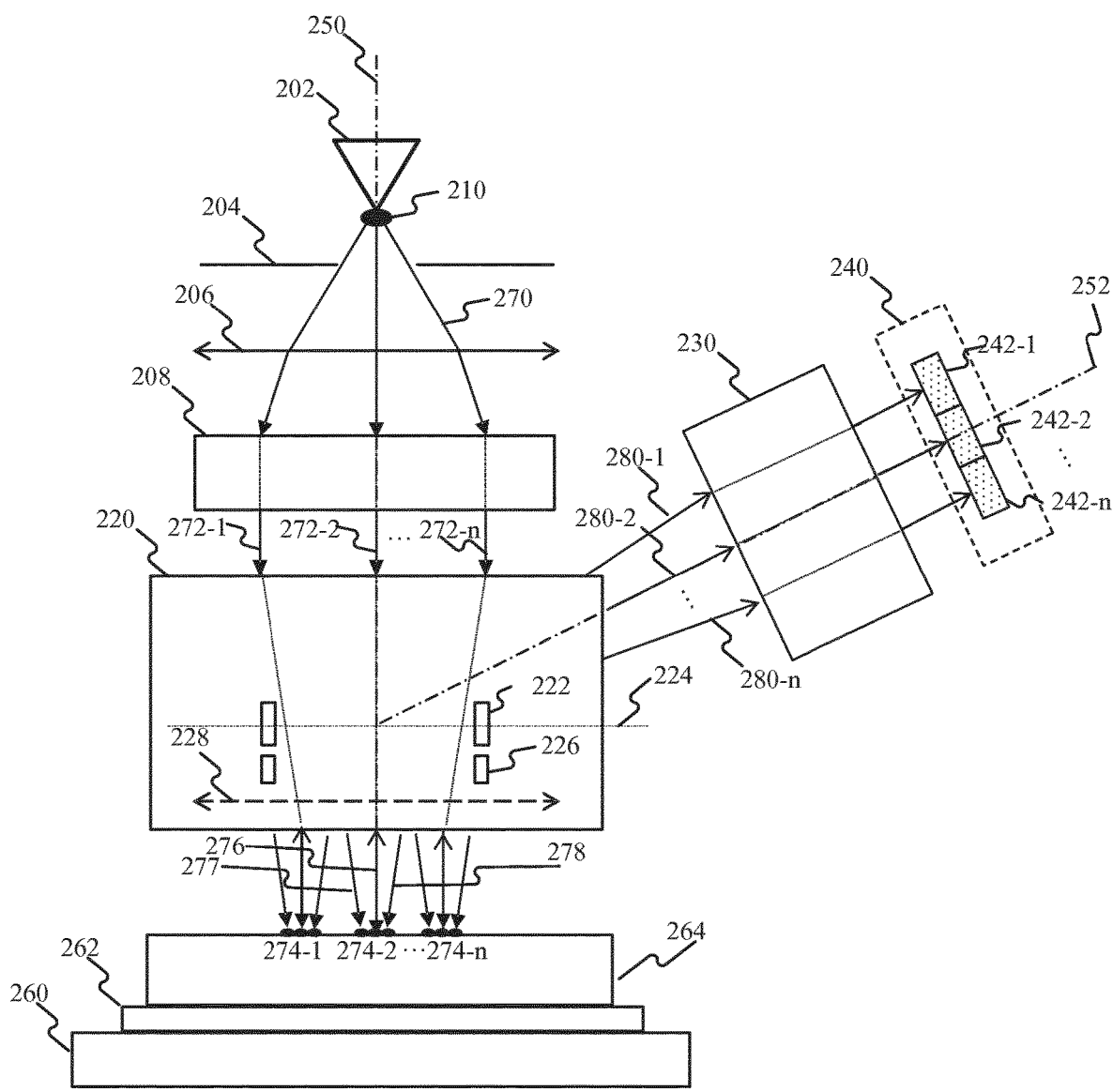
FIG. 2 is a schematic diagram illustrating an exemplary e-beam tool that can be part of the exemplary EBI system of FIG. 1, consistent with embodiments of the present disclosure.

FIG. 2 illustrates an exemplary e-beam tool 104, consistent with disclosed embodiments. Referring to FIG. 2, e-beam tool 104 includes a motorized stage 260 and a wafer holder 262 supported by motorized stage 260. E-beam tool 104 further includes an electron source 202, a gun aperture 204, a condenser lens 206, a source conversion unit 208, a primary projection optical system 220, a secondary optical system 230, and an electron detector 240. Primary projection optical system 220 may include a beam separator 222, a deflection scanning unit 226, and an objective lens 228.

In the disclosed embodiments, electron source 202, gun aperture 204, condenser lens 206, source conversion unit 208, beam separator 222, deflection scanning unit 226, and objective lens 228 may be aligned with a primary optical axis 250 of e-beam tool 104. Secondary optical system 230 and electron detector 240 may be aligned with a secondary optical axis 252 of e-beam tool 104.

When e-beam tool 104 operates, a wafer 264 to be inspected is mounted or placed on wafer holder 262. Electron source 202 includes a cathode, and an extractor or an anode. A voltage is applied between the anode/extractor and cathode, such that primary electrons are emitted from the cathode and extracted or accelerated to forma primary electron beam 270 with high energy (e.g., 8-20 keV), high angular intensity (e.g., 0.1-1 mA/sr), and a crossover (virtual or real) 210. Primary electron beam 270 may be visualized as being emitted from crossover 210. Gun aperture 204 may block off peripheral electrons of primary electron beam 270 to reduce Coulomb effect.

Source conversion unit 208 may include an array of image-forming elements (not shown in FIG. 2) and an array of beam-limit apertures (not shown in FIG. 2). The array of image-forming elements may include an array of micro-deflectors or micro-lenses. The array of image-forming elements may split primary electron beam 270 into a plurality of primary beamlets 272-1, 272-2, . . . , 272-n. For illustrative purpose only, FIG. 2 shows three primary beamlets. However, the number of the primary beamlets is not limited to three and the array of image-forming elements may be configured to split primary electron beam 270 into a greater number of primary beamlets. In addition, the array of image-forming elements may form a plurality of parallel images (virtual or real) of crossover 210. Each of the plurality of primary beamlets 272-1, 272-2, . . . , 272-n may be visualized as being emitted from one of the plurality of parallel images of crossover 210. The array of beam-limit apertures may limit or adjust the sizes of the plurality of primary beamlets 272-1, 272-2, . . . , 272-n.

Condenser lens 206 may focus primary electron beam 210. As such, the electric currents of primary beamlets 272-1, 272-2, . . . , 272-n downstream of source conversion unit 208 may be varied by adjusting the focusing power of condenser lens 206 or by changing the radial sizes of the corresponding beam-limit apertures within the array of beam-limit apertures. Objective lens 228 may focus primary beamlets 272-1, 272-2, . . . , 272-n onto wafer 264 for inspection and may form a plurality of probe spots 274-1, 274-2, . . . , 274-n on surface of wafer 264.

Deflection scanning unit 226 may deflect primary beamlets 272-1, 272-2, . . . , 272-n to scan probe spots 274-1, 274-2, . . . , 274-n over a surface area of wafer 264. In response to incidence of primary beamlets 272-1, 272-2, . . . , 272-n at probe spots 274-1, 274-2, . . . , 274-n, secondary electrons may be emitted from wafer 264. The secondary electrons may comprise electrons with a distribution of energies including secondary electrons (energies≤50 eV) and backscattered electrons (energies between 50 eV and landing energies of primary beamlets 272-1, 272-2, . . . , 272-n).

Beam separator 222 may be a beam separator of Wien filter type generating an electrostatic dipole field and a magnetic dipole field. In some embodiments, if the electrostatic dipole field and magnetic dipole field are applied, the force exerted by the electrostatic dipole field on an electron of primary beamlets 272-1, 272-2, . . . , 272-n may be equal in magnitude and opposite in direction to the force exerted on the electron by the magnetic dipole field. Primary beamlets 272-1, 272-2, . . . , 272-n may therefore pass straight through beam separator 222 with zero deflection angle. However, the total dispersion of primary beamlets 272-1, 272-2, . . . , 272-n generated by beam separator 222 may be non-zero. For a dispersion plane 224 of beam separator 222, for example, FIG. 2 shows dispersion of beamlet 274-2 with nominal energy $V_0$ and an energy spread $\Delta V$ into beamlet portions 276 corresponding to energy $V_0$, beamlet portion 277 corresponding to energy $V_0+\Delta V/2$, and beamlet portion 278 corresponding to energy $V_0-\Delta V/2$. As such, the total force exerted by beam separator 222 on a secondary electron is non-zero. Beam separator 222 may therefore separate the secondary electrons from primary beamlets 272-1, 272-2, . . . , 272-n and direct the secondary electrons towards secondary optical system 230.

Electron detector 240 includes a plurality of detection cells 242-1, 242-2, . . . , 242-n. Secondary optical system 230 may focus the secondary electrons into a plurality of secondary electron beams 280-1, 280-2, . . . , 280-n, and project these secondary electron beams onto one or more of detection cells 242-1, 242-2, . . . , 242-n. Detection cells 242-1, 242-2, . . . , 242-n may be configured to detect secondary electron beams 280-1, 280-2, . . . , 280-n and generate corresponding signals used to reconstruct an image of surface area of wafer 264. A controller may be coupled to electron detector 240.

Figure 3:
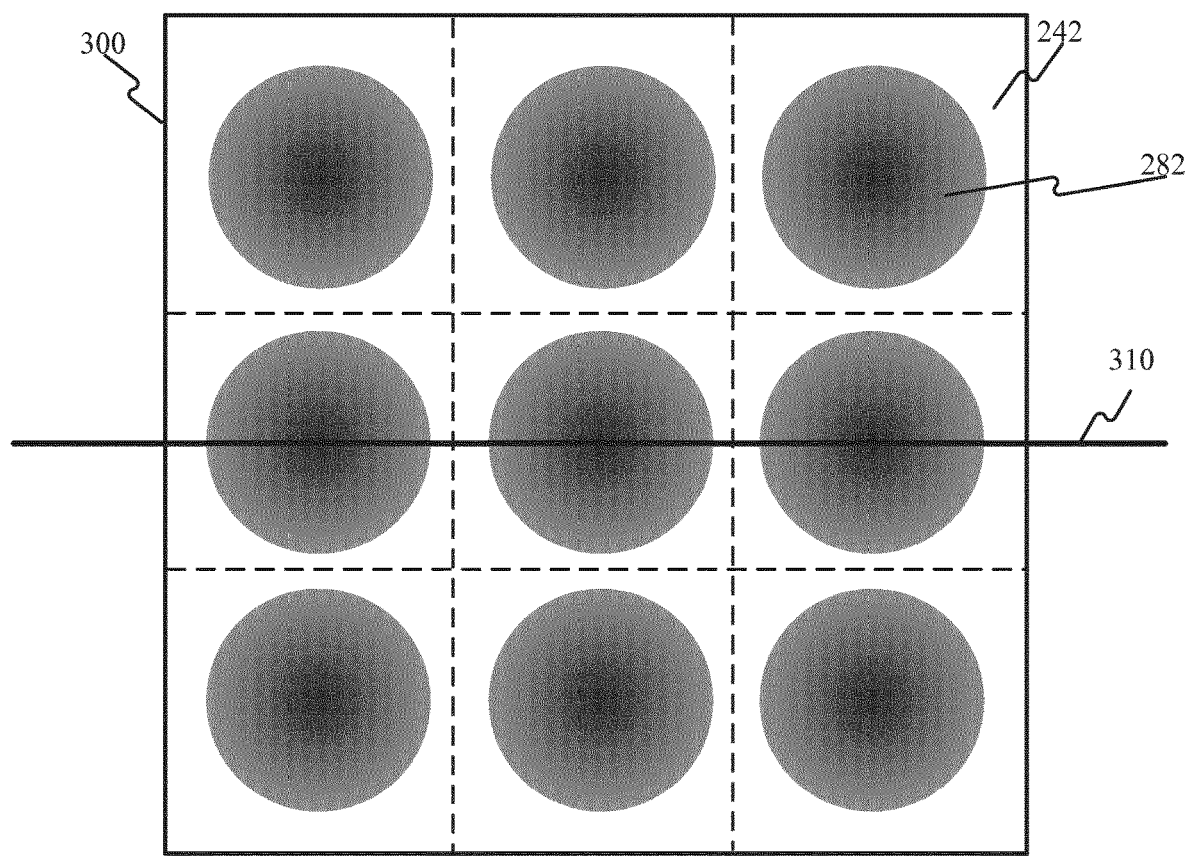
FIG. 3 is a view illustrating a sensor surface of an exemplary electron detector, consistent with embodiments of the present disclosure.

FIG. 3 is a diagram illustrating a sensor surface 300 of electron detector 240, according to some embodiments of the present disclosure. Referring to the example shown in FIG. 3, electron detector 240 may be divided into nine detection cells 242-1, 242-2, . . . , 242-9, which may be arranged in a grid as conceptually illustrated by the dashed lines in FIG. 3.

Detection cells 242-1, 242-2, . . . , 242-9 may correspond to nine detection sub-regions on sensor surface 300. Consistent with some disclosed embodiments, sensor surface 300 need not be physically divided into detection sub-regions. That is, the dashed lines in FIG. 3 may not represent any actual structures on sensor surface 300. Rather, as described in more detail below, detections cells may be formed at the bottom of electron detector 240. Further, electron detector 240 may have a structure capable of forming an internal electrical field, which may be configured to guide the electrons incident on each detection sub-region to a corresponding detection cell. Because a detector may not require any particular structure on sensor surface 300 to separate incident electrons, the entire sensor surface 300 may be used to receive electrons. Dead area on sensor surface 300 may be substantially eliminated.

One or more secondary electron beams 280, as shown in FIG. 2, may form a plurality of beam spots 282-1, 282-2, . . . , 282-n on sensor surface 300 of electron detector 240. For example, nine beam spots 282-1, 282-2, . . . , 282-9 may be formed. Each detection cell 242 may be capable of receiving a corresponding beam spot 282, generating a signal (e.g., voltage, current, etc.) representing the intensity of the received beam spot 282, and providing the signal to a data processing system for generating an image of an area of wafer 264.

Similar to the description regarding primary beamlets 272, the present disclosure does not limit the number of secondary electron beams 280. As such, the present disclosure also does not limit the number of detection cells 242 in electron detector 240, as well as the number of beam spots 282 detectable by electron detector 240. For example, consistent with disclosed embodiments, electron detector 240 may include an array of 2×2, 4×5, or 20×20 detection cells 242 that may be arranged in a matrix along sensor surface 300.

Moreover, although FIG. 3 shows detection cells 242-1, 242-2, . . . , 242-9 arranged as a 3×3 rectangular grid in a plane parallel to sensor surface 300, it is appreciated that the detection cells may be arranged in an arbitrary manner, or that the shapes of the detection cells may be arbitrary. For example, in some embodiments, detection cells may have a triangular or hexagonal shape.

In exemplary embodiments, each detection cell 242 includes one or more electron sensing elements. A sensing element may include a diode. For example, each electron sensing element may include a PiN or NiP diode. A sensing element may also be an element similar to a diode that can convert incident energy into a measurable signal. In some embodiments, each electron sensing element may generate a current signal commensurate with the electrons received in the active area of the electron sensing element. A preprocessing circuit may amplify the current signal and convert the amplified current signal into a voltage signal (representing the intensity of the received electrons). The preprocessing circuit may include, for example, pre-amp circuitries such as a charge transfer amplifier (CTA), a transimpedance amplifier (TIA), or an impedance conversion circuit coupled with a CTA or TIA. A processing system may generate an intensity signal of the electron beam spot by, for example, summing the currents generated by the electron sensing elements located within a sensor region, correlate the intensity signal with a scan path data of the primary electron beam incident on the wafer, and construct an image of the wafer based on the correlation.

Figure 4:
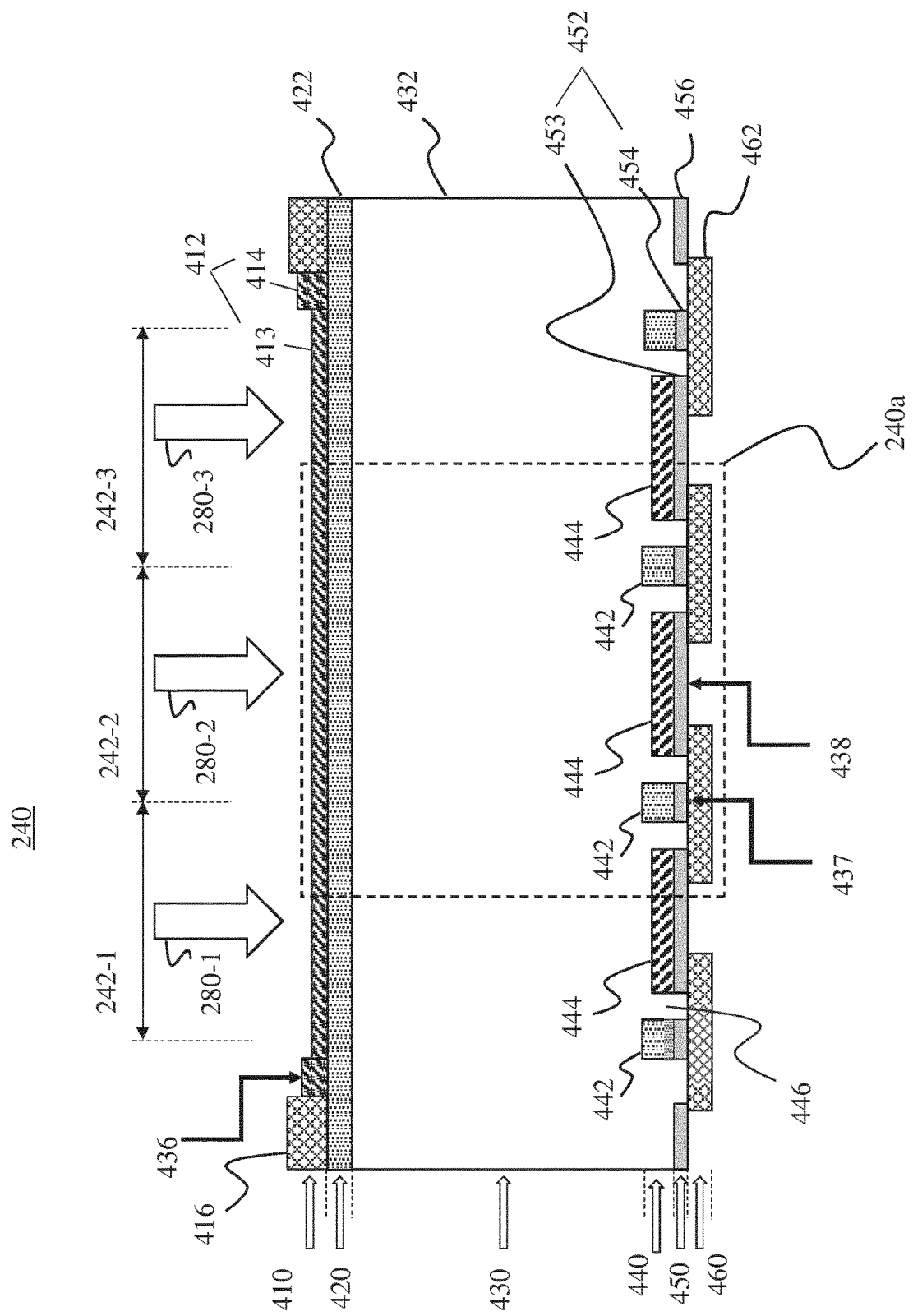
FIG. 4 is a representation illustrating an exemplary structure of an electron detector taken along a cross section in the thickness direction of the electron detector, consistent with embodiments of the present disclosure.

FIG. 4 is a diagram illustrating an exemplary structure of electron detector 240 taken along a cross section in the thickness direction of electron detector 240, according to some embodiments of the present disclosure. For example, the cross section may be formed by cutting electron detector 240 along a plane (e.g., plane 310 in FIG. 3) parallel to one of the detector's sides. Referring to FIG. 4, electron detector 240 may have a layered structure that includes layers 410, 420, 430, 440, 450, and 460 along the thickness direction of electron detector 240.

Specifically, layer 410 may include a first metal layer 412. First metal layer 412 is a layer for receiving electrons incident on electron detector 240, such as secondary electron beams 280-1, 280-2, . . . , 280-n (FIG. 2, collectively referred to as secondary electron beams 280). Thus, first metal layer 412 is configured as an electron-incident surface of electron detector 240. For example, a material of first metal layer 412 may be aluminum or other metal that is highly conductive and easily penetrable by signal electrons (e.g., metals having a small atomic number). Moreover, layer 410 may include an insulator 416, such as silicon dioxide ($SiO_2$), formed surrounding first metal layer 412, so as to protect first metal layer 412.

In some embodiments, for example as shown in FIG. 4, first metal layer 412 may be divided into a center portion 413 and a boundary portion 414. Center portion 413 may be used for receiving incident secondary electron beams, while boundary portion 414 may be used for receiving a bias voltage to be applied on first metal layer 412. Boundary portion 414 may be made thicker than center portion 413, so as to facilitate the receiving of the bias voltage. For example, the thicknesses of center portion 413 may be in the range of 10 to 200 nm, and boundary portion 414 may be in the range of 1 to 10 μm. Thickness of center portion 413 may be set based on a consideration of allowing a predetermined amount of current to be conducted through center portion 413 while substantially allowing incident electrons, such as secondary electrons, to pass though unimpeded. Center portion 413 may be set to remain substantially permeable to incident electrons. Thickness of center portion 413 may be set based on a consideration of blocking of particles other than incident electrons so as to reduce noise. Thickness of boundary portion 414 may be set based on a consideration of allowing low resistivity conduction.

Figure 5:
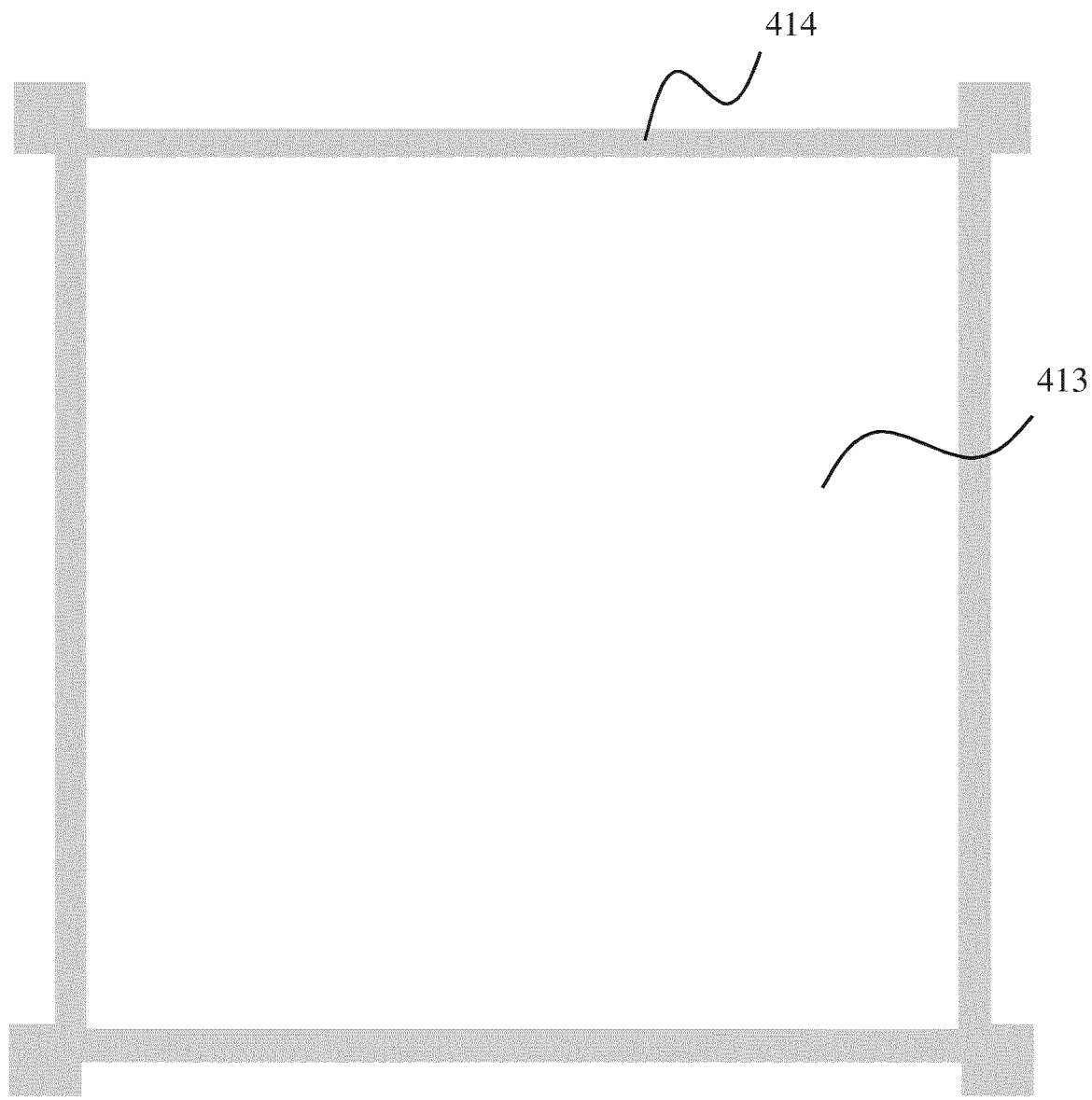
FIG. 5 is a diagram illustrating a top view of a first metal layer of the electron detector shown in FIG. 4, consistent with embodiments of the present disclosure.

FIG. 5 is a diagram illustrating a top view of first metal layer 412, consistent with some embodiments of the present disclosure. As shown in FIG. 5, center portion 413 of first metal layer 412 forms a single detection surface for receiving the incident secondary electron beams, while boundary portion 414 of first metal layer 412 is connected to one or more electrodes at its corners. First metal layer 412 may form a substantially square region with dimensions of, for example, 6×6 mm. A width of boundary portion 414 may be, for example, 0.1 mm.

Referring back to FIG. 4, layer 420 is formed adjacent to layer 410 and may include a p-type semiconductor region 422. For example, p-type semiconductor region 422 may be doped with trivalent impurities, such as boron, aluminum, gallium, etc., so as to create free holes. P-type semiconductor region 422 may be a heavily doped region, such as a P+ region. First metal layer 412 may be deposited on top of p-type semiconductor region 422. Thus, p-type semiconductor region 422 may be coated by first metal layer 412.

Layer 430 is formed adjacent to layer 420 and may be an intrinsic semiconductor region 432. For example, intrinsic semiconductor region 432 may be slightly n-doped or p-doped, without any significant dopant species present. Intrinsic semiconductor region 432 may have a doping concentration lower than doping concentrations of other parts of electron detector 240. Intrinsic semiconductor region 432 may have a doping concentration that is set so that it has a high resistance as a result of being lightly doped. Electron detector 240 may be formed from a silicon wafer, for example, in which case intrinsic semiconductor region 432 may be an N-region. A thickness of intrinsic semiconductor region 432 between layer 420 and 440 may be, for example, 175 μm.

Layer 440 is formed adjacent to layer 430 and may include a plurality of n-type semiconductor regions 444 and one or more p-type semiconductor regions 442. Layer 440 is spaced apart from layer 420. The one or more p-type semiconductor regions 442 in layer 440 may be similarly doped as p-type semiconductor region 422 in layer 420. The plurality of n-type semiconductor regions 444 may be doped with pentavalent impurities, such as phosphorous, antimony, arsenic, etc., so as to create free electrons. N-type semiconductor region 444 may be a heavily doped region, such as an N+ region. As shown in FIG. 4, the one or more p-type semiconductor regions 442 are spaced apart from the plurality of n-type semiconductor regions 444 and thus the one or more p-type semiconductor regions 442 do not physically contact the plurality of n-type semiconductor regions 444. In some embodiments, layer 440 may include a plurality of intrinsic regions 446 separating the plurality of n-type semiconductor regions 444 from the one or more p-type semiconductor regions 442, so as to impede conductivity between the plurality of n-type semiconductor regions 444 and the one or more p-type semiconductor regions 442. The plurality of intrinsic regions 446 may be similarly doped as intrinsic semiconductor region 432. In some embodiments, the plurality of intrinsic regions 446 and intrinsic semiconductor region 432 may form a single-piece intrinsic region and may be manufactured from the same substrate. The intrinsic semiconductor forming multiple intrinsic regions 446 and 432 may be contiguous.

Figure 6:
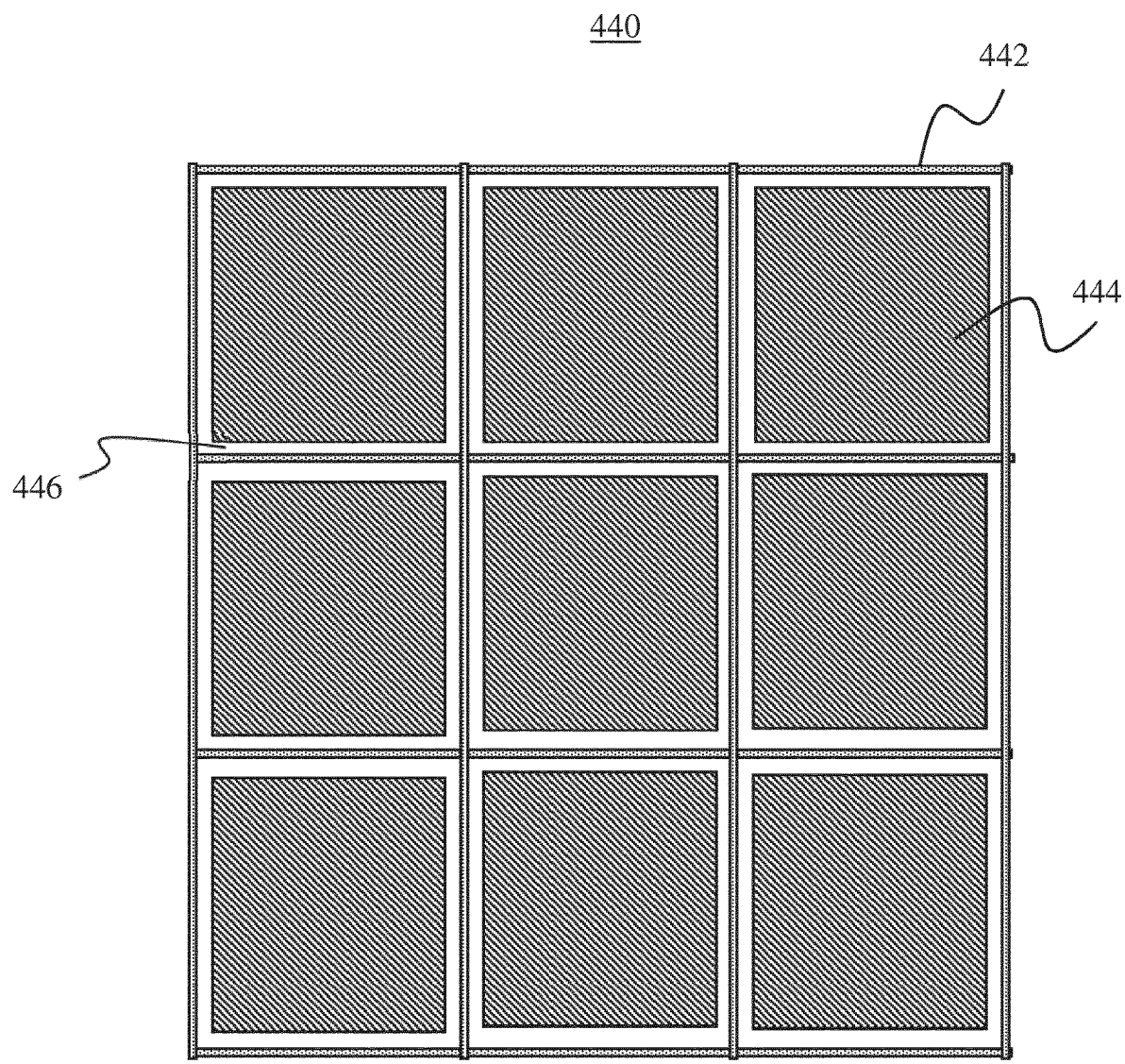
FIG. 6 is a diagram illustrating a plan view of a semiconductor layer of the electron detector shown in FIG. 4, consistent with embodiments of the present disclosure.

FIG. 6 is a diagram illustrating a plan view of layer 440. Referring to FIG. 6, layer 440 includes a plurality of discrete n-type semiconductor regions 444, such as nine n-type semiconductor regions 444 arranged in a rectangular grid. As described in more detail below, each of the nine n-type semiconductor regions 444 may correspond to a detection cell 242 of electron detector 240. Moreover, the plurality of n-type semiconductor regions 444 are partitioned from one another by the one or more p-type semiconductor regions 442. For example, each n-type semiconductor region 444 may be surrounded by p-type semiconductor region 442. In addition, the plurality of n-type semiconductor regions 444 may be separated from the one or more p-type semiconductor regions 442 by intrinsic regions 446.

Referring back to FIG. 4, layer 450 includes second metal layer 452 that may be deposited on the plurality of n-type semiconductor regions 444 and one or more p-type semiconductor regions 442. A material of second metal layer 452 may be metal with high surface conductivity, such as gold or copper. Unlike first metal layer 412, second metal layer 452 not need be highly electron penetrable. Thus, the atomic number of the material of second metal layer 452 may be higher than that of first metal layer 412. Second metal layer 452 may include output lines (not shown in FIG. 4) for carrying current from each of the plurality of n-type semiconductor regions 444. Output lines may be the same as those for applying a bias to n-type semiconductor regions 444, as will be described later.

Second metal layer 452 may include second metal regions 453 and 454 that are separate from one other. Second metal regions 453 and 454 may be formed directly on n-type or p-type semiconductor regions. Therefore, electrical connections may be formed between underlying n-type or p-type semiconductor regions and an external voltage source. Second metal regions 453 and 454 may be independently electrically controlled. Furthermore, an edge metal region 456 may be formed directly on intrinsic semiconductor region 432. Intrinsic semiconductor region 432 may be very lightly doped and thus may have very high resistivity, and thus, any electrical connection between metal region 456 and intrinsic semiconductor region 432 may be highly resistive. In some embodiments, lead wires may be attached to the bottom side of metal regions.

Figure 7:
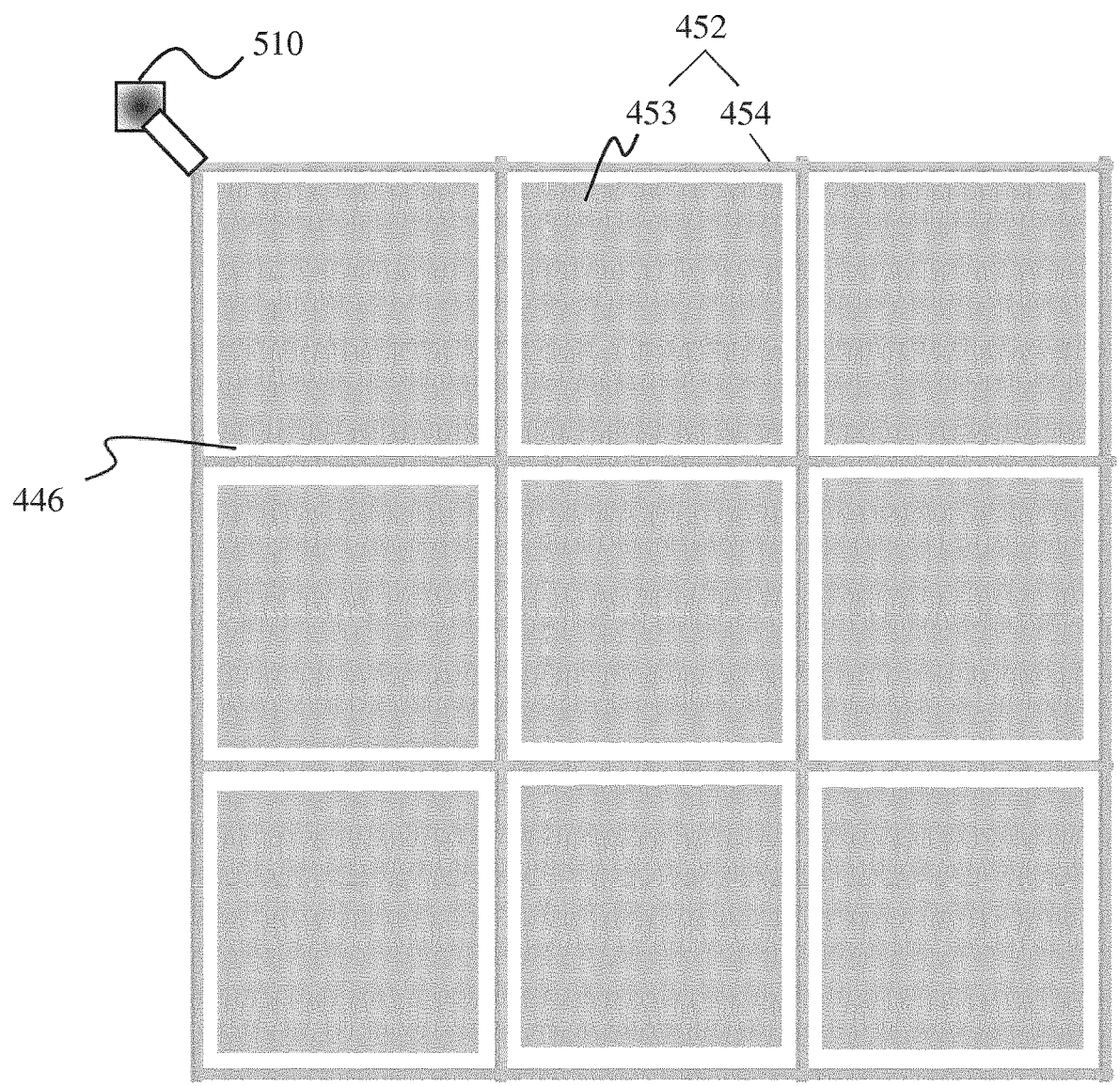
FIG. 7 is a diagram illustrating a plan view of a second metal layer of the electron detector shown in FIG. 4, consistent with embodiments of the present disclosure.

FIG. 7 is a diagram illustrating a plan view of second metal layer 452 that may be deposited on layer 440. Referring to FIG. 7, second metal layer 452 may be deposited on the surface of the plurality of n-type semiconductor regions 444 to form a plurality of second metal regions 453, and deposited on the one or more p-type semiconductor regions 442 to form one or more second metal regions 454. Second metal regions 453 do not physically contact with the one or more second metal regions 454, so as to impede conductivity between the plurality of n-type semiconductor regions 444 and the one or more p-type semiconductor regions 442. The gap between second metal regions 453 and second metal regions 454 may remain empty or be filled with an intrinsic semiconductor material, such as intrinsic regions 446. During operation of electron detector 240, the one or more p-type semiconductor regions 442 may be connected to one or more electrodes, such as pad 510 to receive a bias voltage, such that bias voltage may be applied to the one or more p-type semiconductor regions 442. Bias voltage may be applied to the one or more p-type semiconductor region 442 via second metal region 454.

Referring back to FIG. 4, layer 460 includes an insulation layer 462 that may cover the gap between the second metal deposited on the plurality of n-type semiconductor regions 444 and the second metal deposited on the one or more p-type semiconductor regions 442. Insulation layer 462 is made of the same material as insulation layer 416. Insulation layer 462 may overlap the gap between second metal regions 453 and second metal regions 454 or may fill the gap. The material constituting insulation layer 462 may be similar to the material of insulator 416, e.g., $SiO_2$.

Figure 8:
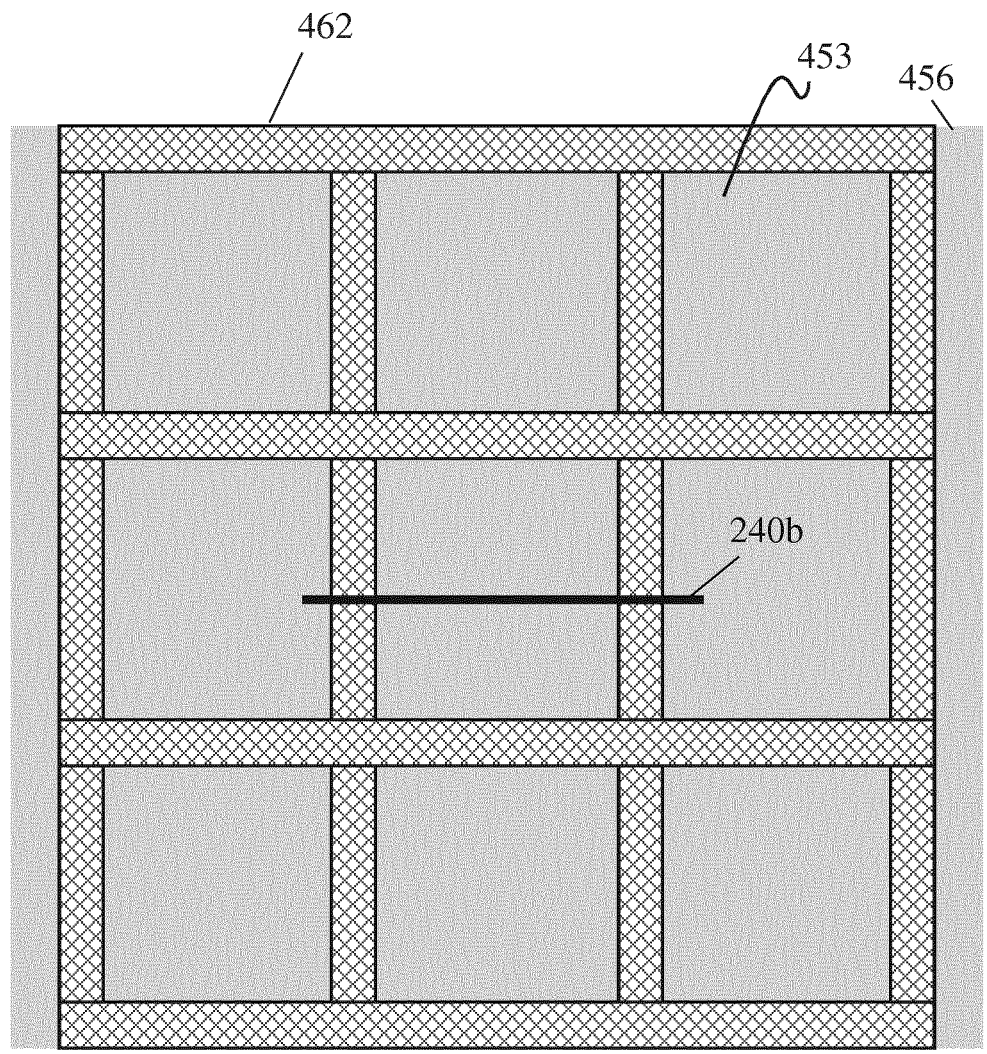
FIG. 8 is a diagram illustrating a plan view of an insulation layer of the electron detector shown in FIG. 4, consistent with embodiments of the present disclosure.

FIG. 8 is a diagram illustrating a plan view of insulation layer 462 that may be deposited on second metal layer 452. Referring to FIG. 8, insulation layer 462 may be used to cover the gap between second metal regions 453 and second metal regions 454, so as to prevent a short circuit between second metal regions 453 and second metal regions 454. In exemplary embodiments, when used in an e-beam tool (e.g., e-beam tool 104), electron detector 240 may be packaged to a ceramic board or a printed circuit board. Output lines may be extended from each second metal region 453 to direct output signals to a data processing system. A section 240b, as indicated in FIG. 8, may correspond to a portion 240a, as enlarged and shown in greater detail in FIG. 9A.

Referring back to FIG. 4, each n-type region 444 in layer 440 and at least a portion of p-type layer 422 may form a PiN diode. Because p-type semiconductor regions and n-type semiconductor regions may be physically separated from one another, attractive fields may be formed between them. For example, charge carriers may have a tendency to flow between a p-type semiconductor region and an n-type semiconductor region due to concentration gradient. PiN diodes may make up a part of a detection cell 242 of electron detector 240. For example, FIG. 4 shows three detection cells (i.e., PiN diodes) 242-1, 242-2, and 242-3. During operation of detector 240, a voltage may be applied across the PiN diodes. For example, a bias 436 may be applied to p-type semiconductor layer 422 through boundary portion 414 of first metal layer 412. A bias 437 may be applied to the one or more p-type semiconductor regions 442 in layer 440 through second metal region 452. Also, a bias 438 may be applied to each of the plurality of n-type semiconductor regions 444 in layer 440 via second metal region 453. Biases may be applied so that PiN diodes are operated in a reverse bias mode. Biases 436 and 438 may be fixed while bias 437 is variable. In one example, biases are applied as follows:

Bias 436=0 V

Bias 437=variable (supplied by pad 510 as shown in FIG. 7)

Bias 438=+30 V

Variable bias 437 may be adjustable within a range of, for example −5 to −100 V. As such, detection cells (e.g., PiN diodes) 242-1, 242-2, and 242-3 may be controlled so that fields are formed in intrinsic semiconductor region 432. Because of biases applied to p-type semiconductor layer 422, to p-type semiconductor regions 442 in layer 440, and to n-type regions 444, electric fields may be formed that cause electrons to be attracted to n-type regions 444. When secondary electron beams 280 are incident on the top surface of first metal layer 412, secondary electron beams 280 falling on first metal layer 412 in an area of one detection cell may be caused to move in directions so as to reach corresponding n-type regions 444. N-type semiconductor regions 444 may then output current signals commensurate with the received secondary electron beams 280 to a pre-processing circuit. Bias 437 may be controlled so as to minimize cross talk between adjacent detection cells. Output signals from n-type semiconductor regions 444 may be used in feedback control for adjusting bias 437. Therefore, bias 437 may be adjustable in real time.

Figure 9A:
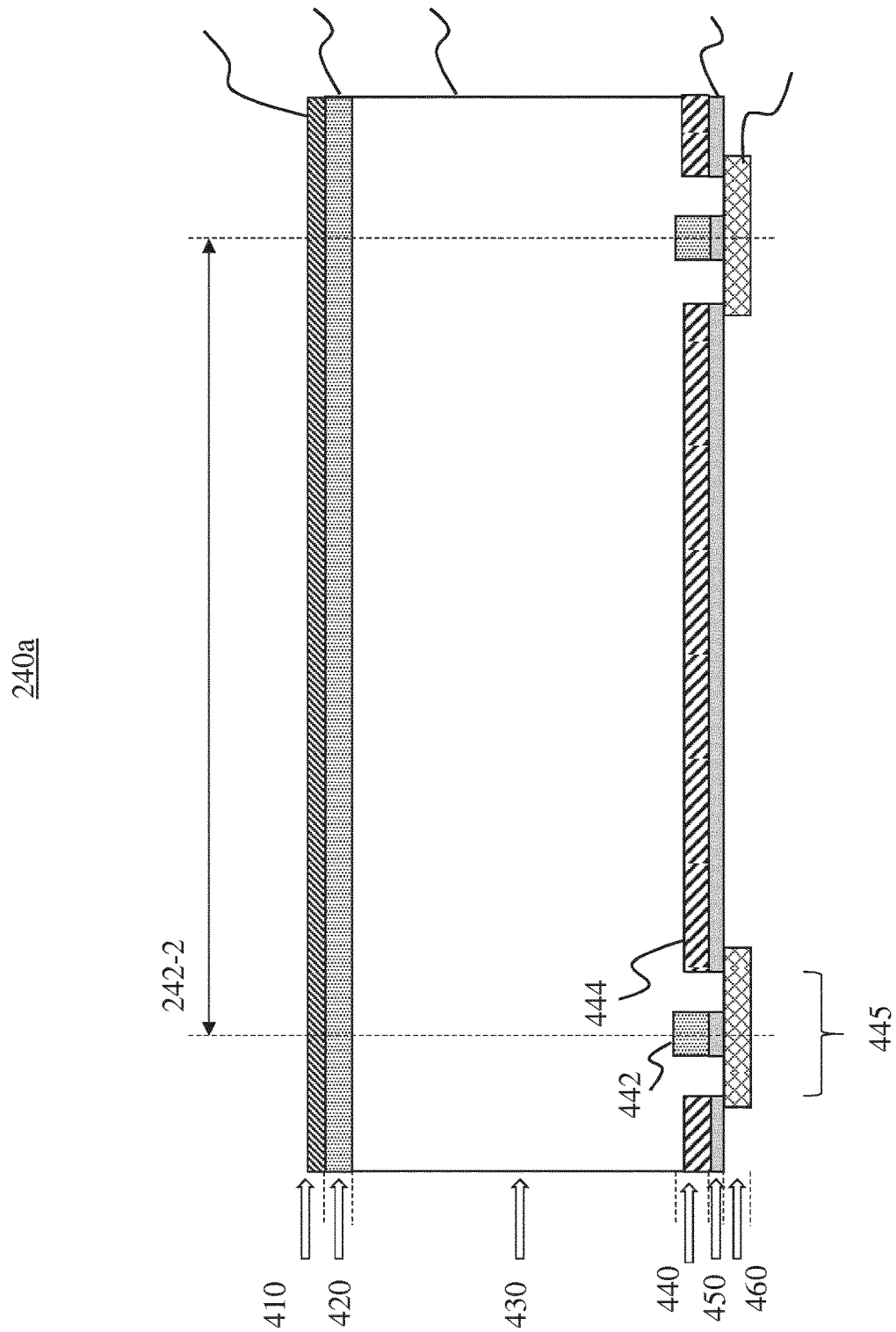
FIGS. 9A-9D are diagrams illustrating an enlargement of a portion of a cross section of electron detector of FIG. 4.

Portion 240a of electron detector 240 is enlarged and shown in greater detail in FIGS. 9A-9F. Reference is now made to FIG. 9A, which illustrates a layer structure of portion 240a that makes up a part of detector 240. FIG. 9A shows a cross-sectional view of one full detection cell 242-2. The plurality of detection cells of electron detector 240 may be considered to be demarcated by discontinuities in the plurality of n-type semiconductor regions 444. For example, detection cells may be considered to be demarcated by the one or more p-type semiconductor regions 442, as shown by the dashed lines in FIG. 9A. A single detection cell may be defined as a region between adjacent semiconductor regions 442. One region among the plurality of n-type semiconductor regions 444 may be associated with one detection cell.

Electron detector 240 may comprise a planar structure including a plurality of layers. The layers may extend in a two-dimensional plane perpendicular to a thickness direction of electron detector 240. A width direction may be perpendicular to the thickness direction. For example, p-type semiconductor layer 422 may be constituted by a substantially planar layer at the top surface of a semiconductor substrate. First metal layer 412 may be deposited on top of p-type semiconductor layer 422 after doping impurities are introduced into the semiconductor substrate. In a separate processing step, doping impurities may be introduced on the back surface of the semiconductor substrate. For example, layer 440 may be formed before or after forming layer 420.

Electron detector 240 may comprise layer 440 at a bottom side thereof (an example of layer 440 is illustrated in FIG. 4). Layer 440 may be formed by patterning a semiconductor substrate. For example, layer 440 may be formed by selectively introducing different species of doping impurities by means of, among other things, a mask. Layer 440 may comprise the plurality of n-type semiconductor regions 444 and one or more p-type semiconductor regions 442, as shown in FIG. 9A. The plurality of n-type semiconductor regions 444 and one or more p-type semiconductor regions 442 may be coplanar. In some embodiments, a thickness of each of the plurality of n-type semiconductor regions 444 and one or more p-type semiconductor regions 442 may be equal. In some embodiments, the thicknesses of respective regions may be different. For example, a doping process may be controlled so that the depth of n-type semiconductor regions or p-type semiconductor regions may be adjusted. A width of each of the plurality of n-type semiconductor regions 444 may be greater than that of the one or more p-type semiconductor regions 442.

The plurality of n-type semiconductor regions 444 may be partitioned from one another. For example, a partition region 445 may be provided between each of the plurality of n-type semiconductor regions 444 in a direction perpendicular to the thickness direction of electron detector 240. Partition region 445 that partitions the plurality of n-type semiconductor regions from one another may include the one or more p-type semiconductor regions 442. Furthermore, as shown in FIG. 4, each of the plurality of n-type semiconductor regions 444 may be surrounded by a region that includes the one or more p-type semiconductor regions 442. As shown in FIG. 6, in a plan view, there may be a peripherally continuous outer portion including the one or more p-type semiconductor region 442 that surrounds all of the plurality of n-type semiconductor regions 444. N-type semiconductor regions and p-type semiconductor regions may be provided alternately.

Figure 9B:
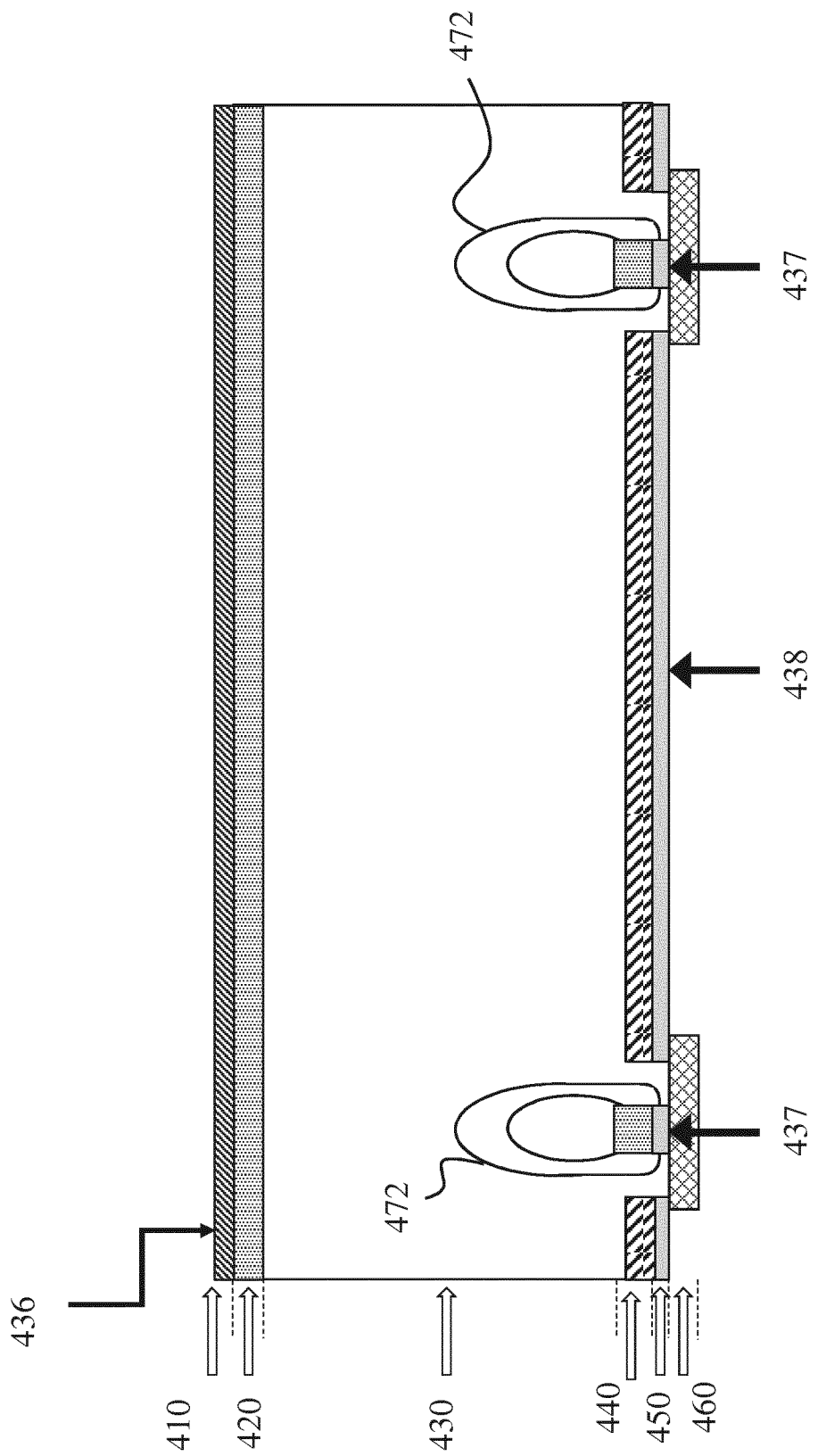

Reference will now be made to FIG. 9B. When operating the plurality of detection cells 242 of electron detector 240 as diodes, bias may be applied to various portions of electron detector 240. FIG. 9B shows equipotential electric field lines in electric fields 472 emanating from p-type semiconductor regions while bias 437 is applied. It is understood that the shapes of fields shown, including those near the edges of structures, are merely schematic and may be distorted due to, for example, edge effects.

Figure 9C:
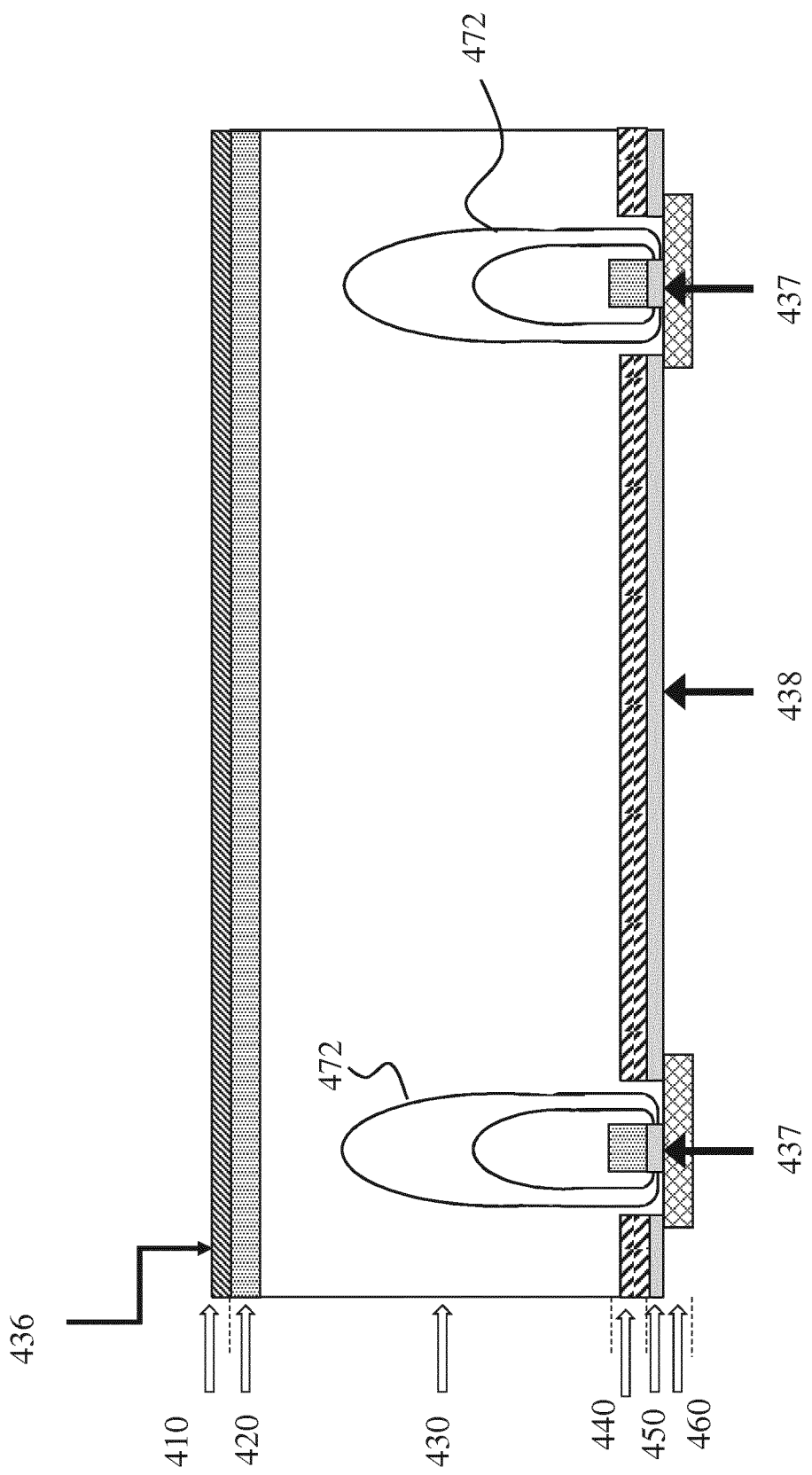

As bias 437 is varied, electric fields 472 may be manipulated. For example, bias 437 may be adjusted so that electric fields 472 are made larger. FIG. 9C shows the effect of increasing electric fields 472. In some embodiments, parameters may be adjusted so that an electric field is formed that substantially fills intrinsic regions in a vertical region in the thickness dimension of electron detector 240.

In some embodiments, biases 436 and 438 may be held constant while bias 437 is adjustable. Bias 437 can be varied to minimize crosstalk between detector cells, such as detector cells 242-1 and 242-2 of electron detector 240. Bias 437 can be varied to adjust electric fields 472 to impede an electron that enters a region of a first detector cell, such as an electron of secondary electron beam 280-1 that enters a region of detector cell 242-1, or any electron in the region of the first detector cell, from passing to a second detector cell, such as detector cell 242-2. Voltage applied to the one or more p-type semiconductor regions 442 may be controlled separately from wafer bias to control the width of segment separation. Characteristics of electric fields formed in diodes of electron detector 240 may be manipulated by varying bias 437, for example.

Figure 9D:
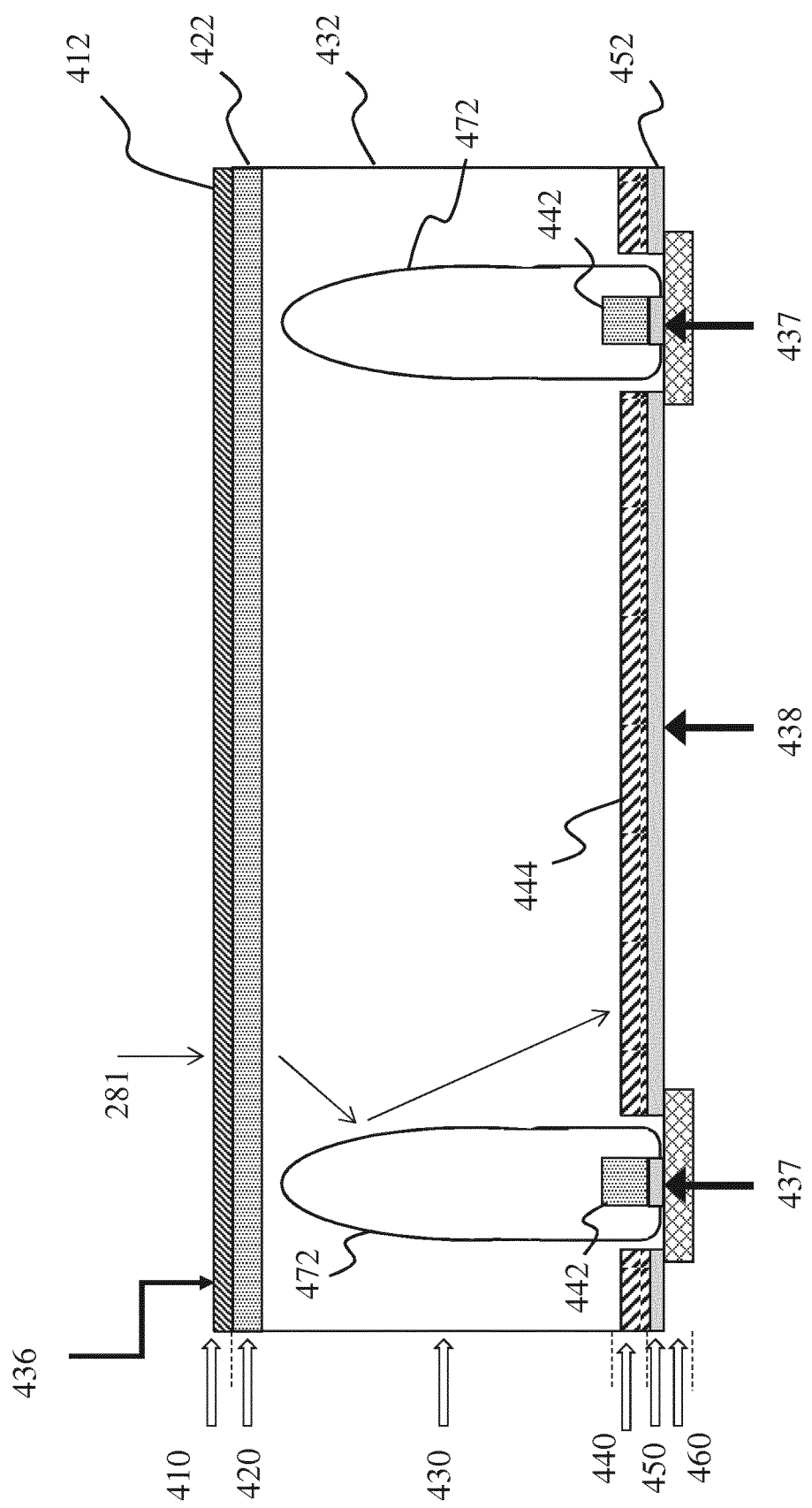

Reference is now made to FIG. 9D, which illustrates a situation of incident electrons from secondary electron beam 280 falling on a detection cell of electron detector 240. In operation, electrons incident on the top surface of metal layer 412 may pass through metal layer 412 and may enter p-type semiconductor region 422. Upon reaching p-type semiconductor region 422, incident electrons may interact with p-type semiconductor region 422, collide with or otherwise interact with other electrons, etc., and thus may scatter and be directed to travel in random directions. However, when appropriate biases are applied to, e.g., 422, 442, 444, electrons may be attracted toward each of the plurality of n-type semiconductor regions 444 in respective detection cells due to interactions with p-type semiconductor region 422. For example, because p-type semiconductor region 422 may be highly doped with positive charge carriers (holes), there is an excess of holes. When a high energy electron strikes a region in the vicinity of the junction between p-type semiconductor region 422 and intrinsic region 432, the electron may be absorbed into the lattice of p-type semiconductor region 422. This may create a vacancy, thus generating further charge carriers. Charge carriers generated in the diodes of electron detector 240 may separate due to field conductivity wherein holes have a tendency to move toward p-type semiconductor region 422 while electrons are attracted toward the closest one of the plurality of n-type semiconductor regions 444 due to biases 436 and 438. Furthermore, electric fields 472 may cause a repulsion of approaching electrons. For example, as shown in FIG. 9D, an incoming electron 281 may, upon entering p-type semiconductor region 422, be directed toward an adjacent detection cell. However, electric fields 472 may impede electron 281 from traveling through intrinsic region 432 so as to cross over into another detection cell. Instead, electron 281 may be attracted toward the respective one of the plurality of n-type semiconductor regions 444 associated with the detection cell in which electron 281 initially landed. In this way, crosstalk between adjacent detection cells may be reduced. Bias 437 may be controlled so that electric fields 472 create a barrier that confines electrons within respective detection cells and thus may prevent crosstalk. Furthermore, electrons generally have higher mobility than holes. Therefore, detector 240 operating with diodes in the above-discussed mode may be advantageous for increasing bandwidth and response time of electron detector 240.

In some embodiments, behavior of incident electrons in diodes making up electron detector 240 may be affected by doping concentration, operating parameters of the diode, etc. Such behavior, including, for example, electron velocity, may be described by equations such as that for drift velocity.

Signal output may be collected from each of the plurality of n-type semiconductor regions 444. Signal lines may be provided for carrying current from each of the plurality of n-type semiconductor regions 444. In some embodiments, a line used for an output signal may be the same as that used to apply bias 438. Incident electrons may cause a DC signal fluctuation that may be used as a signal indicating intensity of a received electron beam.

It can be seen from the above description that electron detector 240 may employ different mechanisms to form multiple detection cells. First, for example, the bottom (e.g., layer 440) of electron detector 240 may be partitioned into multiple n-type regions 444 for gathering different electrons. Second, electric field in intrinsic semiconductor region 432 may not only direct incident electrons to respective detection cells, but also help to ensure there is no cross-talk between electrons belonging to different detection cells. In some embodiments, the sensor surface of electron detector 240 may not be partitioned, and the entire center portion 413 of first metal layer 412 may be used to receive incident electrons, such that there is no dead area on center portion 413. Therefore, an electron detector can be provided that has a high detection efficiency.

In accordance with some embodiments, secondary electrons incident on different areas of the sensor surface of electron detector 240 may be accurately directed to corresponding n-type regions. As such, electron detector 240 may be particularly suitable for use in multi-beam inspection systems that employ a large number of primary electron beams.

While electron detector 240 is described as receiving secondary electrons, it is readily appreciated that a multi-cell detector may also be used to detect other types of charged particles, such as positively charged particles. Moreover, a multi-cell detector in accordance with the present disclosure is not limited to being constructed from p-type and n-type semiconductors. Rather, consistent with the disclosed embodiments, materials with different conductivities may be used to fulfill the same functions of the above-described p-type and n-type semiconductors. As such, "p-type" as used herein may be generalized as a first conductivity type, and "n-type" as used herein may be generalized as a second conductivity type.

Figure 10:
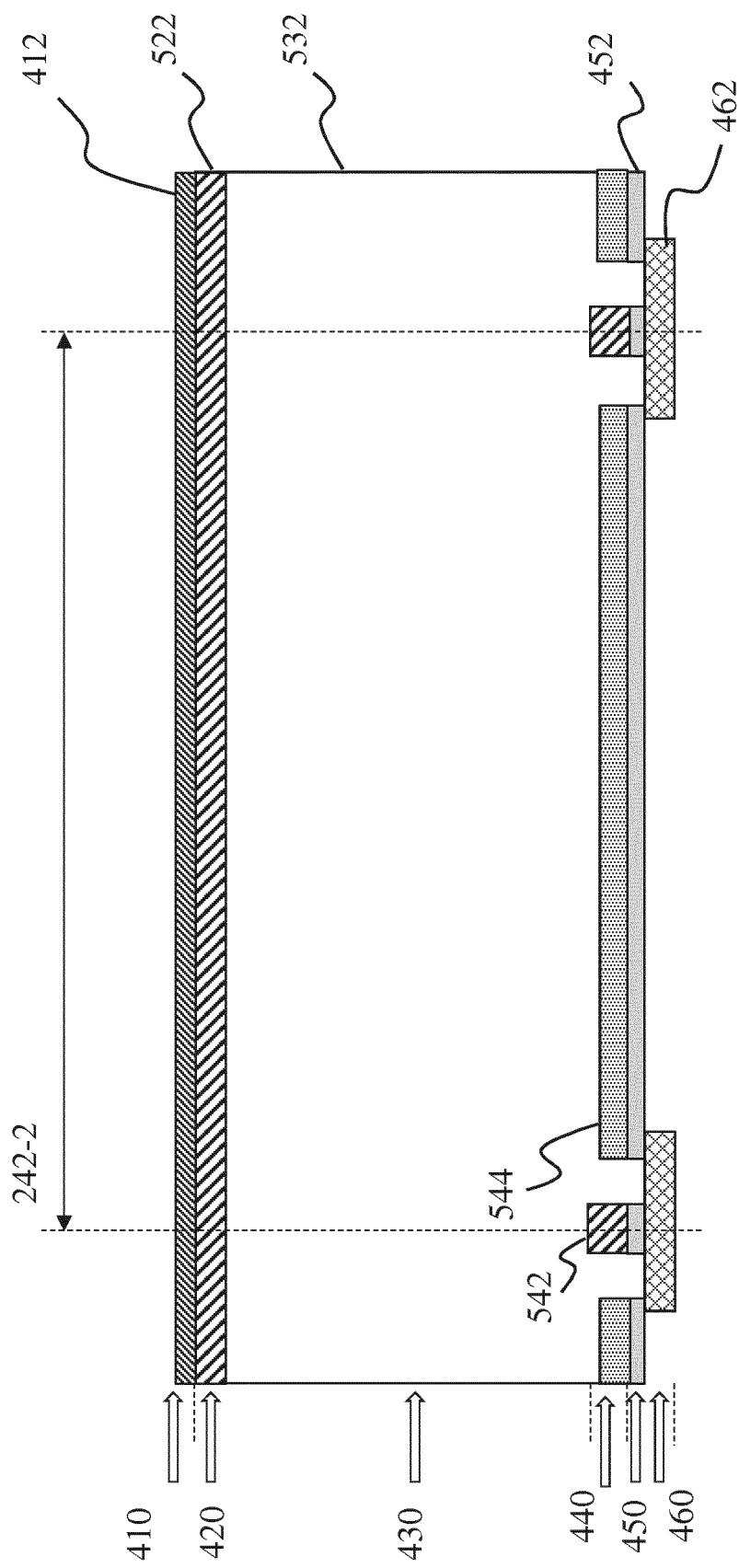
FIG. 10 is a diagram illustrating an enlargement of a portion of a cross section of an exemplary detector, consistent with embodiments of the present disclosure.

Referring now to FIG. 10, an alternative embodiment is discussed. In some embodiments, regions of p-type semiconductor and n-type semiconductor may be reversed. FIG. 10 illustrates a portion of electron detector 240 similar to that discussed above with respect to FIGS. 4-9. The embodiment of FIG. 10 differs from that of, for example FIG. 4 in that p-type semiconductor regions and n-type semiconductor regions are switched. Thus, electron detector 240 may be provided with n-type semiconductor region 522, one or more n-type semiconductor regions 542, and a plurality of p-type semiconductor regions 544. As shown in FIG. 10, each of the plurality of p-type regions 544 in layer 440 and at least a portion of n-type semiconductor region 522 may form a NiP diode. Each of the NiP diodes may make up a part of a detection cell 242 of electron detector 240. For example, FIG. 10 shows a view of detection cell 242-2 (e.g., NiP diode). During operation of detector 240, a voltage may be applied across the NiP diodes. For example, a bias may be applied to n-type semiconductor region 522 through first metal layer 412. A bias may also be applied to the one or more n-type semiconductor regions 542 through second metal region 452, for example, in a manner similar to that of bias 437 being applied to the one or more p-type semiconductor regions 442 discussed above with respect to FIG. 4. Also, another bias may be applied to each of the plurality of p-type semiconductor regions 544 in layer 440. When diodes are operated in this manner, for example, an electron detector may be provided that achieves high sensitivity.

Figure 11:
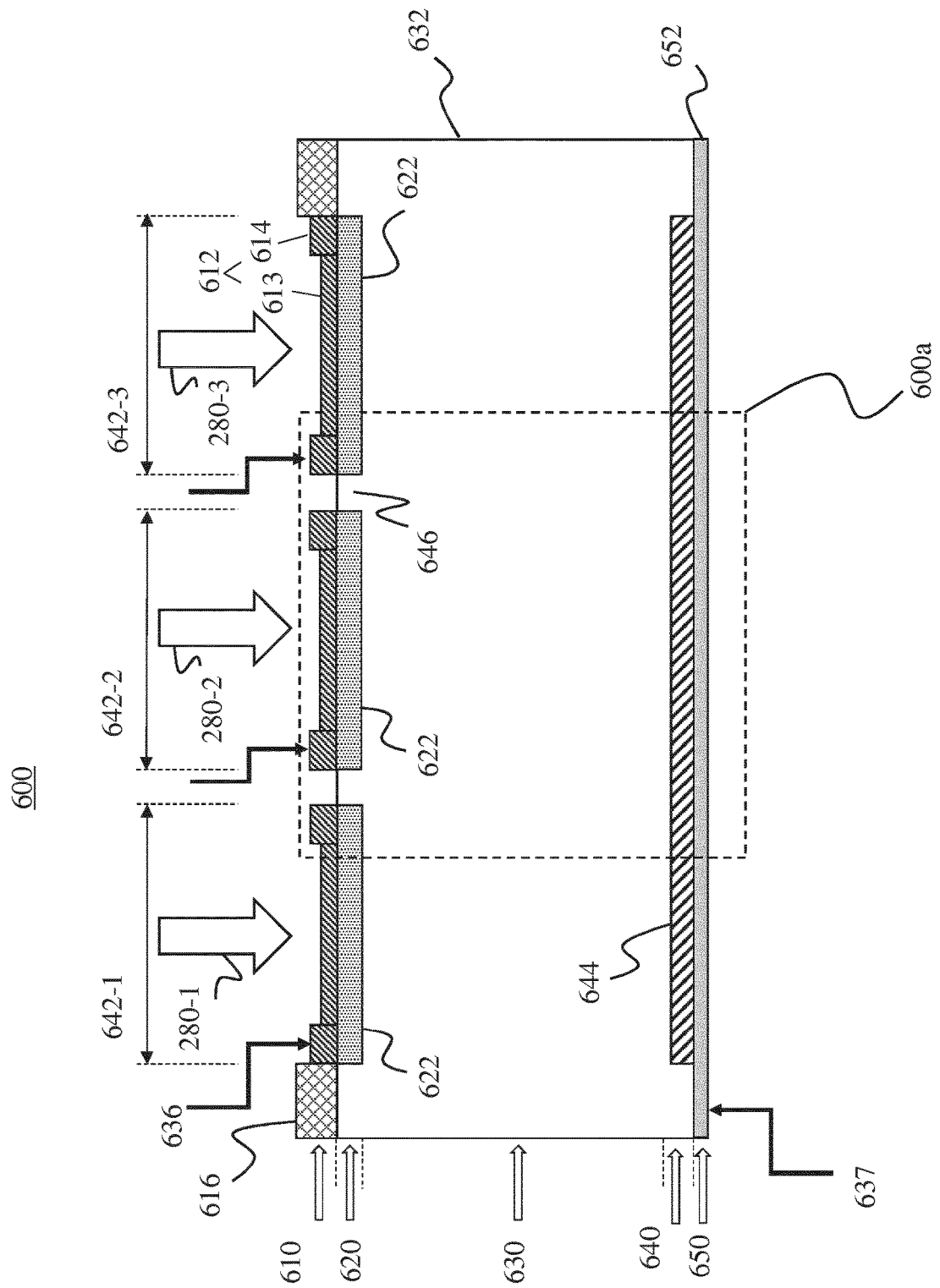
FIG. 11 is a diagram illustrating an exemplary structure of detector in a cross section, consistent with embodiments of the present disclosure.

Reference is now made to FIG. 11, which illustrates another exemplary embodiment. In some embodiments of the present disclosure, a detector such as that shown in FIG. 11 may include physical separation of detection cells on a top layer of a detector. FIG. 11 illustrates an exemplary structure of an electron detector 600 taken along a cross-section in the thickness direction of electron detector 600. Electron detector 600 may be used in apparatus 104, similar to detector 240, and thus may receive a plurality of secondary electron beams 280-1, 280-2, and 280-3.

Electron detector 600 may have a layered structure that includes layers 610, 620, 630, 640, and 650 along the thickness direction of electron detector 600. Specifically, layer 610 may include a first metal layer 612. First metal layer 612 is a layer for receiving electrons incident on electron detector 600, such as secondary electron beams 280-1, 280-2, . . . , 280-n. A plurality of areas may be provided for receiving one among secondary electron beams 280-1, 280-2, . . . , 280-n, each of the areas being provided with first metal layer 612. For example, electron detector 600 may comprise a plurality of detection cells 642-1, 642-2, . . . , 642-n. In FIG. 11, three detection cells 642-1, 642-2, and 642-3 are shown. First metal layer 612 is configured as an electron-incident surface of electron detector 600. For example, a material of first metal layer 612 may be aluminum or other metal that is highly conductive and easily penetrable by signal electrons (e.g., a metal having a small atomic number). Moreover, layer 610 may include an insulator 616, such as silicon dioxide ($SiO_2$), formed surrounding first metal layer 612.

In some embodiments, for example as shown in FIG. 11, first metal layer 612 may be divided into a center portion 613 and a boundary portion 614. Center portion 613 may be used for receiving incident secondary electron beams, while boundary portion 614 may be used for receiving a bias voltage to be applied on first metal layer 612, or for carrying a signal output from electron detector 600. Boundary portion 614 may be made thicker than center portion 613, so as to carry current or voltage. For example, the thicknesses of center portion 613 may be in the range of 10 to 200 nm and boundary portion 614 may be in the range of 1 to 10 μm. A bias 636 may be applied to first metal layer 612.

Figure 12:
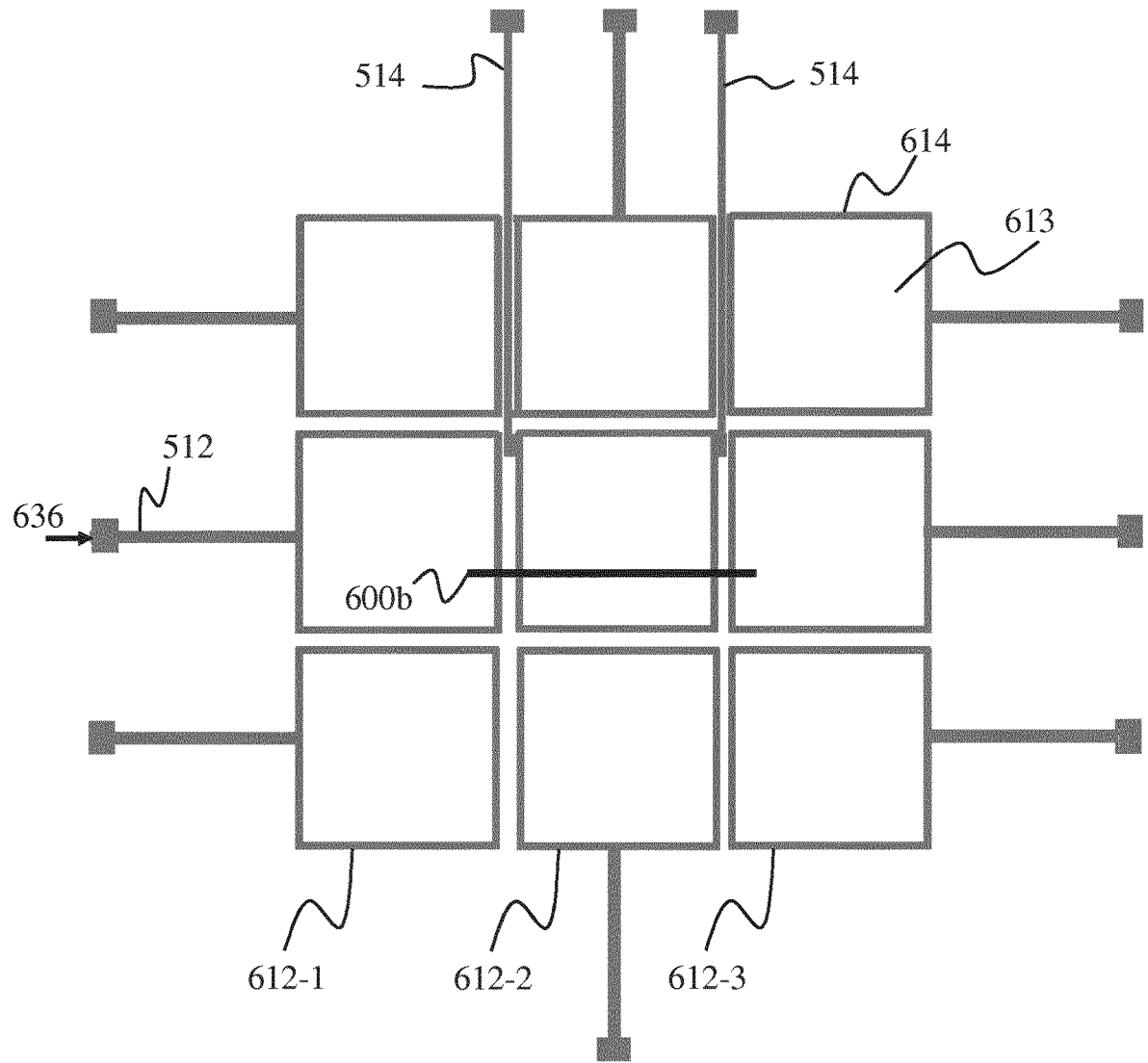
FIG. 12 is a diagram illustrating a top view of a first metal layer of the electron detector shown in FIG. 11, consistent with embodiments of the present disclosure.

FIG. 12 is a diagram illustrating a top view of first metal layer 612, consistent with embodiments of the present disclosure. As shown in FIG. 12, center portion 613 of first metal layer 612 forms a detection surface for receiving an incident secondary electron beam, while boundary portion 614 of first metal layer 612 is connected to one or more output lines 512. First metal layer 612 may include a plurality of discrete metal portions 612-1, 612-2, . . . , 612-n, corresponding to each of the plurality of p-type semiconductor regions 622. Metal portions, for example, 612-1, 612-2, and 612-3, may correspond to respective detection cells. Metal portions 612-1, 612-2, and 612-3 may each have a fully enclosed center portion 613 and boundary portion 614. Metal portions 612-1, 612-2, and 612-3 may be spaced apart from one another. Areas on an outer periphery of electron detector 600 may be connected via output lines 512, while areas on an interior may be connected via output lines 514. Bias 636 may be applied through output lines 512 or 514. For reduced area, output lines 514 may be made thinner than output lines 512. For example, output lines 514 may have a width of 0.05 mm and output lines 512 may have a width of 0.1 mm. There may be two output lines 514 provided for one detection cell on the interior, while one output line 512 may be provided for one detection cell on the periphery of a die forming electron detector 600. Each detection cell bounded by boundary portion 614 may have dimensions of 1.9×1.9 mm. A section 600b, as indicated in FIG. 12, may correspond to a portion 600a, as enlarged and shown in greater detail in FIG. 16.

Referring back to FIG. 11, layer 620 is formed adjacent to layer 610 and may include a plurality of p-type semiconductor regions 622. The plurality of p-type semiconductor regions 622 may be, for example, doped with trivalent impurities, such as boron, aluminum, gallium, etc., so as to create free holes. The plurality of p-type semiconductor regions 622 may be heavily doped regions, such as a P+ regions. Each of the plurality of p-type semiconductor regions 622 may correspond to one detection cell.

Layer 630 is formed adjacent to layer 620 and may be an intrinsic semiconductor region 632. Intrinsic semiconductor region 632 may be, for example, slightly n-doped or p-doped, without any significant dopant species present. Electron detector 600 may be formed from a silicon wafer, for example, in which case intrinsic semiconductor region 632 may be an N-region.

As shown in FIG. 11, the plurality of p-type semiconductor regions 622 may not physically contact one another. The plurality of p-type semiconductor regions 622 may be spaced apart with a uniform spacing. In some embodiments, layer 620 may include a plurality of intrinsic regions 646 for separating the plurality of p-type semiconductor regions 622 from one another. The plurality of intrinsic regions 646 and intrinsic semiconductor region 632 may form a single-piece intrinsic region and be manufactured from the same substrate.

Layer 640 is formed adjacent to layer 630 and may include an n-type semiconductor region 644. The n-type semiconductor region 644 may be doped with pentavalent impurities, such as phosphorous, antimony, arsenic, etc., so as to create free electrons. N-type semiconductor region 644 may be a heavily doped region, such as a N+ region.

Figure 13:
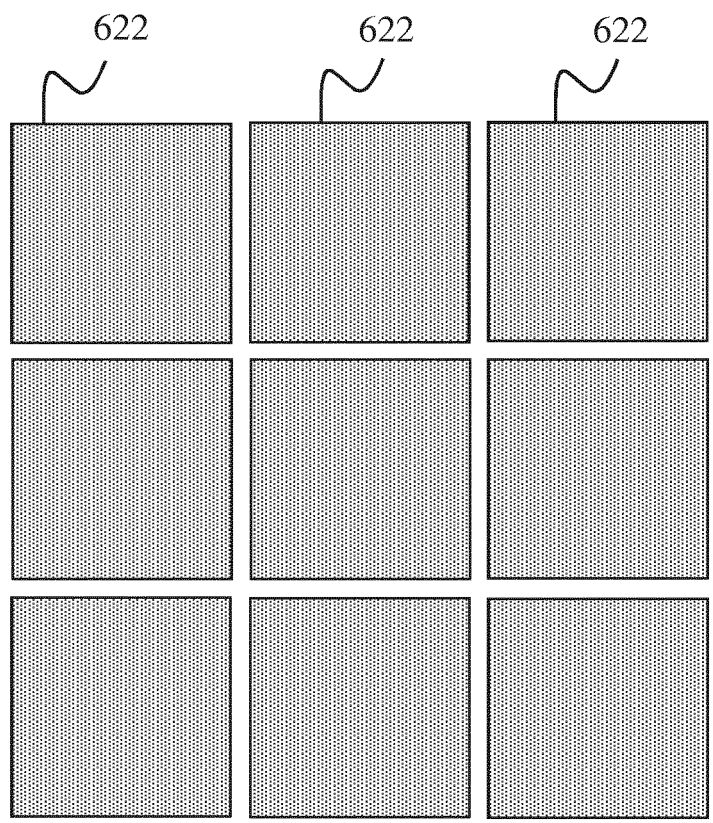
FIG. 13 is a diagram illustrating a plan view of a semiconductor layer of the electron detector shown in FIG. 11, consistent with embodiments of the present disclosure.

FIG. 13 is a diagram illustrating a plan view of layer 620. Referring to FIG. 13, layer 620 includes a plurality of discrete p-type semiconductor regions 622, such as nine p-type semiconductor regions 622 arranged in a rectangular grid. As described in more detail below, each of the nine p-type semiconductor regions 622 corresponds to a detection cell 642 of electron detector 600. Moreover, the plurality of p-type semiconductor regions 622 are spaced apart from one another. In some embodiments, the plurality of p-type semiconductor regions 622 may be separated from one another by intrinsic regions 646 (shown in FIG. 11). Furthermore, an insulating layer comprising a material similar to that of insulator 616 may be formed on top of intrinsic regions 646.

Figure 14:
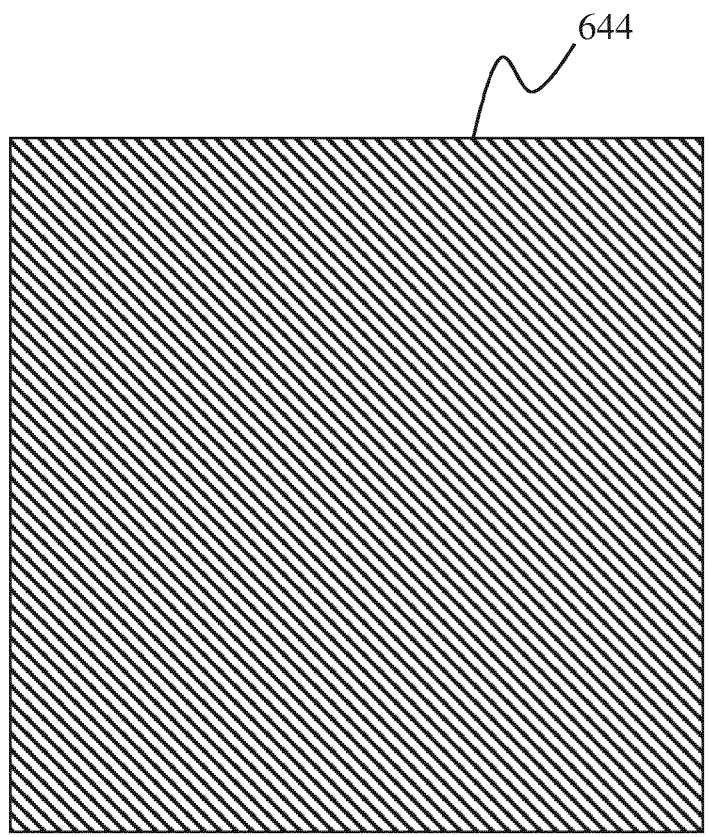
FIG. 14 is a diagram illustrating a plan view of another semiconductor layer of the electron detector shown in FIG. 11, consistent with embodiments of the present disclosure.

FIG. 14 is a diagram illustrating a plan view of layer 640. Layer 640 includes n-type semiconductor region 644. N-type semiconductor region 644 may make up an entire surface of one side of a substrate forming detector 600. Layer 640 may be formed similar to layer 420 of detector 240.

Referring back to FIG. 11, layer 650 includes second metal layer 652 that may be deposited on n-type semiconductor region 644. A material of second metal layer 652 may be metal with high surface conductivity, such as gold or copper. Unlike first metal layer 612, second metal layer 652 not need be highly electron penetrable. Thus, the atomic number of the material of second metal layer 652 may be higher than that of first metal layer 612. Second metal layer 652 may include output lines (not shown in FIG. 11) for applying a bias to n-type semiconductor region 644. For example, bias 637 may be applied to n-type semiconductor region 644 via second metal layer 652.

Figure 15:
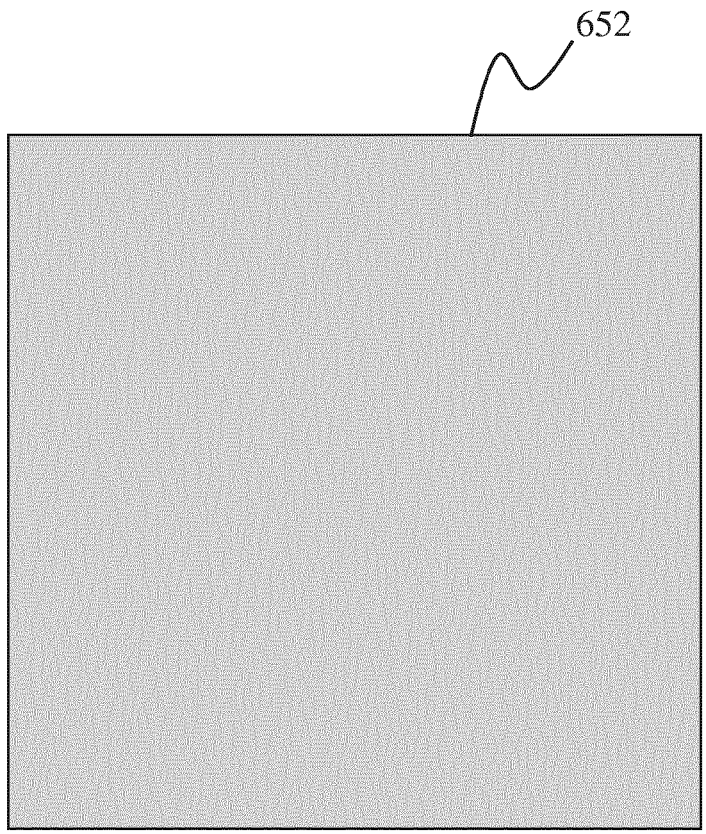
FIG. 15 is a diagram illustrating a plan view of a second metal layer of the electron detector shown in FIG. 11, consistent with embodiments of the present disclosure.

FIG. 15 is a diagram illustrating a plan view of second metal layer 652 that may be deposited on layer 640. Referring to FIG. 15, second metal layer 652 may be deposited on the surface of n-type semiconductor region 644 to form a single contiguous surface. An electrode (not shown) may be provided at a corner of second metal layer 652. In some embodiments, second metal layer 652 may extend to the edge of the substrate making up detector 600. Second metal layer 652 may be provided on intrinsic semiconductor region 632. In some embodiments, second metal layer may be provided only on n-type semiconductor region 644. As discussed above with respect to FIG. 11, during operation of electron detector 600, the plurality of p-type semiconductor regions 622 may be connected to one or more electrodes to receive a bias voltage, such as bias 636. The bias voltage may be applied to the plurality of p-type semiconductor regions 622 via first metal layer 612. Output lines may be extended from each detection cell to direct output signals to a data processing system. Meanwhile, bias 637 may be applied to n-type semiconductor region 644.

Each of the plurality of p-type semiconductor regions 622 in layer 620 and at least a portion of n-type semiconductor region 644 may form a PiN diode. PiN diodes may make up a part of a detection cell 642 of electron detector 600. For example, FIG. 11 shows three detection cells (i.e., PiN diodes) 642-1, 642-2, and 642-3. In some embodiments, n-type semiconductor region 644 may be provided as a plurality of discrete sections corresponding to each of the detection cells. During operation of electron detector 600, a voltage may be applied across the PiN diodes. For example, bias 636 may be applied to each of the plurality of p-type semiconductor regions 622 through boundary portion 614 of first metal layer 612. Bias 637 may be applied to n-type semiconductor regions 644 in layer 640 through second metal layer 652. Biases may be fixed to certain values so that a potential difference between n-type semiconductor regions 644 and second metal layer 652 is in the range of −5 to −100. Biases may be set based on application, for example, bandwidth needs. In some embodiments, higher voltage may be used to achieve higher bandwidth. In one example, biases are applied as follows:

Bias 636=−30 V
Bias 637=0 V

As such, detection cells 642-1, 642-2, and 642-3 may act as PiN diodes. Because of biases applied with such polarities to the plurality of p-type semiconductor regions 622 in layer 620 and n-type semiconductor region 644 in layer 640, diodes may become less resistive to current flowing therethrough. Charge carriers may be continuously conducted across the diode. For example, holes may be attracted toward n-type semiconductor region 644 while electrons are attracted toward respective ones of the plurality of p-type regions 622. When secondary electron beams 280 are incident on the top surface of first metal layer 612, secondary electron beams 280 falling on different areas of first metal layer 612 may interact with the plurality of p-type semiconductor regions 622. Due to interactions with p-type semiconductor regions 622, holes may be caused to travel in a downward direction toward n-type semiconductor region 644 while signal electrons are directed upward. Signal electrons may be accelerated toward first metal layer 612 where they may be output as current signals commensurate with the received secondary electron beams 280 to a preprocessing circuit.

Figure 16:
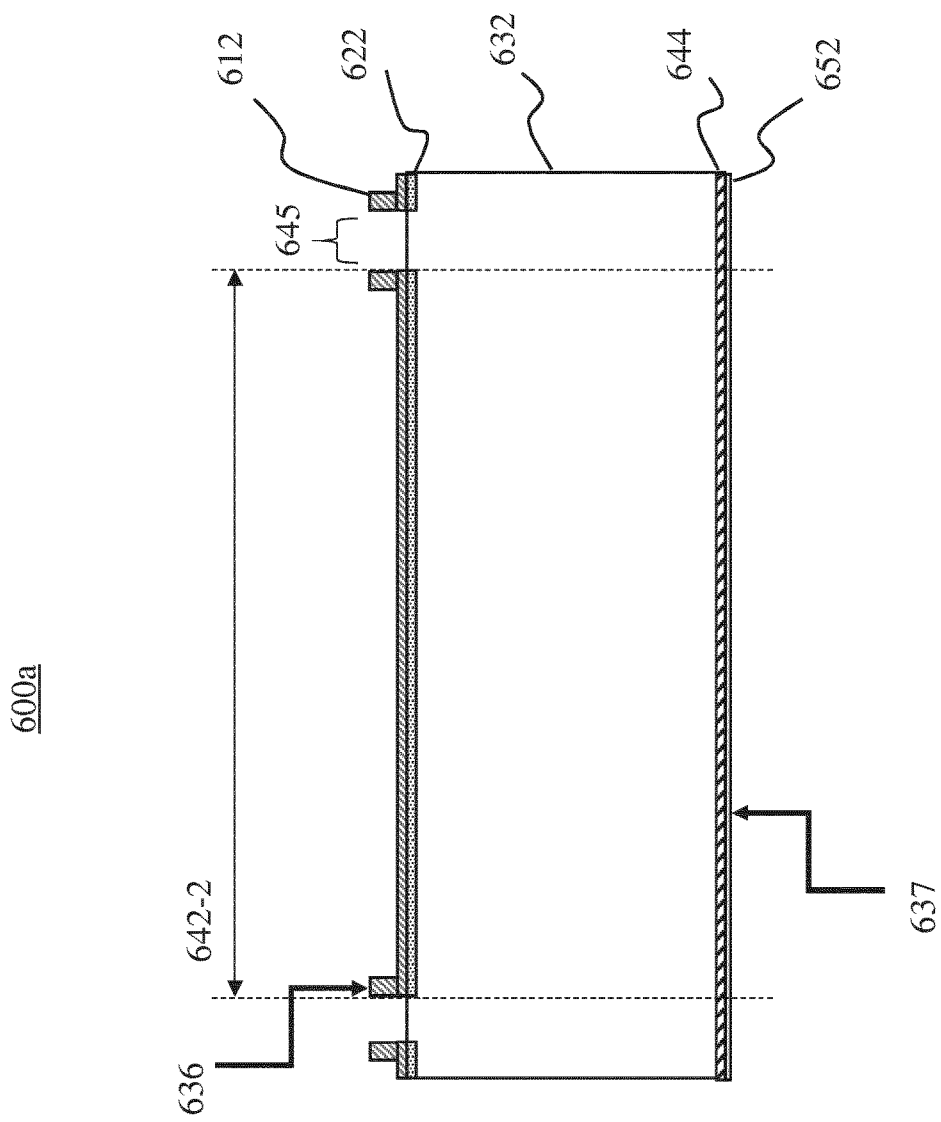
FIG. 16 is a diagram illustrating an enlargement of a portion of a cross section of the electron detectors shown in FIG. 11, consistent with embodiments of the present disclosure.

Portion 600a of electron detector 600 is enlarged and shown in greater detail in FIG. 16. FIG. 16 illustrates a layer structure of portion 600a that makes up a part of detector 600 and shows a cross-sectional view of one full detection cell 642-2. The plurality of detection cells of electron detector 600 may be considered to be demarcated by discontinuities in the plurality of p-type semiconductor regions 622. For example, detection cells may be considered to be demarcated by the edges of the plurality of p-type semiconductor regions 622, as shown by the dashed lines in FIG. 16. A single detection cell may be defined as a region between the side edges of the plurality of p-type semiconductor regions 622. The plurality of p-type semiconductor regions 622 may be partitioned from one another. For example, a partition region 645 may be provided between each of the plurality of p-type semiconductor regions 622 in a direction perpendicular to the thickness direction of electron detector 600. Partition region 645 that partitions the plurality of p-type semiconductor regions from one another may include intrinsic semiconductor material. For example, there may be a monolithic intrinsic region that comprises intrinsic region 632 and portions between the plurality of p-type semiconductor regions 622 in layer 620. An insulator, such as $SiO_2$, may be provided on top of partition region 645. Furthermore, in some embodiments, a single detection cell may be defined as a region between adjacent midpoints in partition regions 645. Different portions of n-type semiconductor region 644 may be associated with different detection cells.

Electron detector 600 may comprise a planar structure including a plurality of layers. The layers may extend in a two-dimensional plane perpendicular to a thickness direction of electron detector 600. For example, n-type semiconductor region 644 may be constituted by a substantially planar layer on one surface of a semiconductor substrate. Second metal layer 652 may be deposited on top of n-type semiconductor layer 644 after doping impurities are introduced into the semiconductor substrate. In a separate processing step, doping impurities may be introduced on the opposite surface of the semiconductor substrate. For example, layer 620 may be formed before or after forming layer 640.

In operation of electron detector 600, when electrons are incident on the top surface of first metal layer 612, intrinsic region 632 may be flooded with charge carriers from the plurality of p-type semiconductor regions 622. An electron-hole pair may be formed wherein the hole is directed toward n-type semiconductor region 644 while the electron is directed in the opposite direction (that is, upwards). Because the thickness of the plurality of p-type semiconductor regions 622 may be very thin, electrons may then travel to first metal layer 612 very quickly. Upon reaching first metal layer 612, electrons may be output via output lines 512 or 514 (shown in FIG. 12). Because electrons in a diode may have higher mobility that holes, electron detector 600 operating in this manner may achieve high bandwidth.

In some embodiments, an apparatus may be provided that comprises a detector as disclosed herein. For example, there may be provided a charged particle beam apparatus that includes a charged particle source configured to generate one or more charged particle beams to be projected on a surface of a sample. The apparatus may further include a detector that includes a first layer including a region of a first conductivity type and a second layer including a plurality of regions of a second conductivity type. The one or more charged particle beams generated from the charged particle source may strike the sample and may then generate charged particles, such as secondary charged particles or backscattered charged particles, that are directed toward the detector. A detector such as electron detector 240 or electron detector 600 may be provided. An amplifier may be provided that may be connected to the detector. The amplifier may be configured to amplify electrical signals output from the plurality of regions of the second conductivity type of the detector. The amplifier may forward the amplified signals to a data processing system. A controller such as controller 109 may be provided that may include the data processing system.

Figure 17:
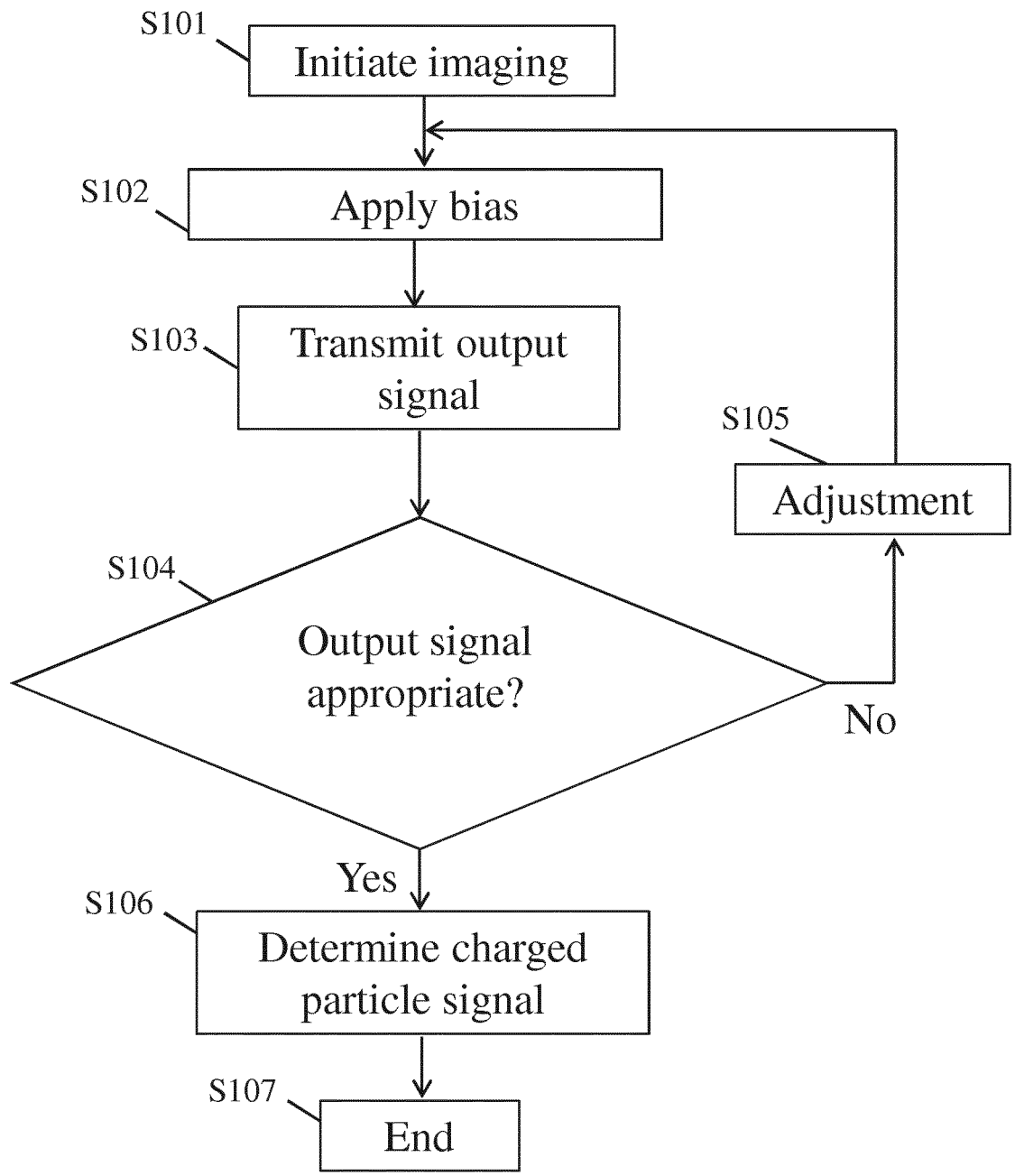
FIG. 17 is a flowchart representing an exemplary method, consistent with embodiments of the present disclosure.

Reference is now made to FIG. 17, which illustrates a flowchart of an exemplary detection method. A controller may be programmed to implement a method including one or more blocks of the flowchart of FIG. 17. The processing of FIG. 17 may be repeated at predetermined intervals. In step S101, charged particle imaging may be started. In a charged particle imaging process consistent with that discussed above with respect to FIG. 2, for example, an instruction may be sent to a charged particle source to emit a charged particle beam. In some embodiments, an electron beam emanating from electron source 202 may be caused to pass through gun aperture 204, condenser lens 206, source conversion unit 208, beam separator 222, deflection scanning unit 226, and objective lens 228 and may be focused into one or more probe spots to impinge on the surface of a sample. The one or more probe spots may be scanned across the surface of the sample. Secondary charged particles emanated from the sample surface may be collected by a detector, such as electron detector 240 or 640, to be used for forming an image of an area of interest on the sample.

In step S102, a bias may be applied to one or more p-type or n-type semiconductor regions of the detector. Step S102 may include applying a bias to a first region of a first conductivity type of a first layer of the detector and applying a bias to a plurality of second regions of a second conductivity type of a second layer of the detector, wherein the detector includes an intrinsic region between the first and second layers.

In some embodiments, step S102 may include applying bias 436 to p-type semiconductor region 422, applying bias 437 to the one or more p-type semiconductor regions 442, and applying bias 438 to the plurality of n-type semiconductor regions 444. In some embodiments, step S102 may include applying bias 636 to the plurality of p-type semiconductor regions 622 and applying bias 637 to n-type semiconductor region 644. Step S102 may include operating a diode in reverse bias. In some embodiments, step S102 may include operating a diode in forward bias.

In step S103, an output signal may be transmitted from one or more p-type or n-type semiconductor regions of the detector. In some embodiments, a plurality of n-type semiconductor regions may output electrical signals commensurate with electrons received. In some embodiments, a plurality of p-type semiconductor regions may output electrical signals commensurate with electrons received. Step S103 may include receiving, by a controller, the output signal of the detector. For example, controller 109 may receive electrical signals from the plurality of n-type semiconductor regions 444 of detector 240, or may receive electrical signals from the plurality of p-type semiconductor regions 622 of detector 600.

In step S104, a determination may be made as to whether the output signal received by the controller in step S103 is appropriate. Step S104 may include determining whether or not an abnormality in a charged particle detection system exists. For example, step S104 may include comparing the output signal of the detector to a value corresponding to normal operation of a reverse biased diode, or a forward biased diode.

When a negative determination is made in step S104 (i.e., the output signal is not appropriate), the process may proceed to step S105. At step S105, an adjustment may be made. An adjustment may include changing a value of a bias to be applied to the detector. For example, step S105 may include adjusting variable bias applied as bias 437 to the one or more p-type semiconductor regions 442 of detector 240. After making an adjustment, the process may return to step S102 and apply the bias, as adjusted.

When an affirmative determination is made in step S104 (i.e., the output signal is appropriate), the process may proceed to step S106. At step S106, a charged particle signal may be determined based on the output signal received in step S103. Step S103 may include amplifying the received output signal. Thereafter, the process may proceed to step S107. At step S107, the process may end. In some embodiments, another process may follow step S106. For example, image processing may be performed based on the output signal of the detector.

In some embodiments, a detector may communicate with a controller that controls a charged particle beam system. The controller may instruct components of the charged particle beam system to perform various functions, such as controlling a charged particle source to generate a charged particle beam and controlling a deflector to scan the charged particle beam. The controller may also perform various post-processing functions, image subdivision, image processing, generating contours, superimposing indicators on an acquired image, and the like. In some embodiments, a module may be provided as a dedicated controller for a detector while another controller controls other components of a charged particle beam system.

A controller consistent with the disclosed embodiments may comprise a storage that is a storage medium such as a hard disk, random access memory (RAM), cloud storage, other types of computer readable memory, and the like. The storage may be used for saving scanned raw image data as original images, and post-processed images. A non-transitory computer readable medium may be provided that stores instructions for a processor of a controller to carry out charged particle beam detection, image processing, or other functions and methods consistent with the present disclosure. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM or any other flash memory, NVRAM, a cache, a register, any other memory chip or cartridge, and networked versions of the same (such as a cloud storage).

The embodiments may further be described using the following first set of clauses. References to clauses in this first set of clauses are to other clauses in this first set of clauses.

1. A detector comprising:
    a first layer including a region of a first conductivity type;
    a second layer including a plurality of regions of a second conductivity type and one or more regions of the first conductivity type, wherein the plurality of regions of the second conductivity type are partitioned from each other by the one or more regions of the first conductivity type of the second layer, and the plurality of regions of the second conductivity type do not physically contact with the one or more regions of the first conductivity type in the second layer; and
    an intrinsic layer between the first and second layers.
2. The detector of clause 1, wherein the first conductivity type is n-type and the second conductivity type is p-type.
3. The detector of clause 2, wherein the second layer further includes one or more intrinsic regions to separate each of the plurality of p-type regions from the one or more n-type regions of the second layer.
4. The detector of clause 3, wherein each of the plurality of p-type regions is surrounded by the one or more intrinsic regions in the second layer.
5. The detector of any one of clauses 3 and 4, wherein each of the plurality of p-type regions is surrounded by the one or more n-type regions in the second layer.
6. The detector of any one of clauses 2 through 5, wherein the intrinsic layer is n-doped, wherein the intrinsic layer provides a doping concentration that is lower than doping concentrations of the first and second layers.
7. The detector of any one of clauses 2 through 6, wherein:
    the n-type region of the first layer is coated with a first metal; and
    the plurality of p-type regions and the one or more n-type regions of the second layer are coated with a second metal.
8. The detector of clause 7, wherein atomic number of the first metal is smaller than atomic number of the second metal.
9. The detector of any one of clauses 7 and 8, wherein the first metal is aluminum.
10. The detector of any one of clauses 7 through 9, wherein the second metal is gold.
11. The detector of any one of clauses 7 through 10, further comprising:
    an insulating layer deposited on the second metal and configured to overlay gaps between the plurality of p-type regions and the one or more n-type regions of the second layer.
12. The detector of any one of clauses 2 through 11, further comprising:
    a plurality of signal output lines connected to the plurality of p-type regions.
13. An apparatus comprising:
    a charged particle source configured to generate a plurality of beams of charged particles to be projected on a surface of a specimen and to cause the specimen to generate electron signals;
    a detector comprising:
        a first layer including a region of a first conductivity type;
        a second layer including a plurality of regions of a second conductivity type and one or more regions of the first conductivity type, the plurality of regions of the second conductivity type are partitioned from each other by the one or more regions of the first conductivity type of the second layer; and
        an intrinsic layer between the first and second layers;
        wherein the region of the first conductivity type in the first layer receives the electron signals, and the plurality of regions of the second conductivity type outputs electrical signals based on the received electron signals; and
    an amplifier configured to amplify the electrical signals outputted by the plurality of regions of the second conductivity type and forward the amplified electrical signals to a data processing system.
14. The apparatus of clause 13, wherein the first conductivity type is n-type and the second conductivity type is p-type.
15. The apparatus of clause 14, wherein the second layer further includes one or more intrinsic regions to separate each of the plurality of p-type regions from the one or more n-type regions of the second layer.
16. The apparatus of clause 15, wherein each of the plurality of p-type regions is surrounded by the one or more intrinsic regions in the second layer.
17. The apparatus of any one of clauses 15 and 16, wherein each of the plurality of p-type regions is surrounded by the one or more n-type regions in the second layer.
18. The apparatus of any one of clauses 14 through 17, wherein the intrinsic layer is n-doped, wherein the intrinsic layer provides a doping concentration that is lower than doping concentrations of the first and second layers.

19. The apparatus of any one of clauses 14 through 18, wherein:
the n-type region of the first layer is coated with a first metal; and
the plurality of p-type regions and the one or more n-type regions of the second layer are coated with a second metal.

20. The apparatus of clause 19, wherein atomic number of the first metal is smaller than atomic number of the second metal.

21. The apparatus of any one of clauses 19 and 20, wherein the first metal is aluminum.

22. The apparatus of any one of clauses 19 through 21, wherein the second metal is gold.

23. The apparatus of any one of clauses 19 through 22, further comprising:
an insulating layer deposited on the second metal and configured to overlay gaps between the plurality of p-type regions and the one or more n-type regions of the second layer.

24. The apparatus of any one of clauses 14 through 23, further comprising:
a plurality of signal output lines connected to the plurality of p-type regions.

25. A method comprising:
applying a positive voltage to an n-type region of a first layer of a detector and one or more n-type regions of a second layer of the detector, the detector including an intrinsic layer between the first and second layers;
receiving electron signals on the first layer; and
outputting electrical signals from a plurality of p-type regions based on the received electron signals,
wherein the plurality of p-type regions are partitioned from each other by the one or more n-type regions of the second layer, and the plurality of p-type regions do not physically contact with the one or more n-type regions in the second layer.

26. The method of clause 25, wherein the second layer further includes one or more intrinsic regions to separate each of the plurality of p-type regions from the one or more n-type regions of the second layer.

27. The method of clause 26, wherein each of the plurality of p-type regions is surrounded by the one or more intrinsic regions in the second layer.

28. The method of any one of clauses 25 through 27, wherein each of the plurality of p-type regions is surrounded by the one or more n-type regions in the second layer.

29. The method of any one of clauses 25 through 28, wherein the intrinsic layer is n-doped, wherein the intrinsic layer provides a doping concentration that is lower than doping concentrations of the first and second layers.

30. The method of any one of clauses 25 through 29, wherein:
the n-type region of the first layer is coated with a first metal; and
the plurality of p-type regions and the one or more n-type regions of the second layer are coated with a second metal.

31. The method of clause 30, wherein atomic number of the first metal is smaller than atomic number of the second metal.

32. The method of any one of clauses 30 and 31, wherein the first metal is aluminum.

33. The method of any one of clauses 30 through 32, wherein the second metal is gold.

The embodiments may additionally be described using the following second set of clauses. References to clauses in this second set of clauses are to other clauses in this second set of clauses.

1. A substrate comprising:
a first layer including a first region of a first conductivity type;
a second layer that includes a plurality of second regions of a second conductivity type and one or more third regions of the first conductivity type, wherein the plurality of second regions are partitioned from one another by the one or more third regions, and the plurality of second regions are spaced apart from the one or more third regions; and
an intrinsic layer between the first layer and the second layer.

2. The substrate of clause 1, wherein the first conductivity type is p-type semiconductor and the second conductivity type is n-type semiconductor.

3. The substrate of one of clauses 1 or 2, wherein the second layer further includes an intrinsic region separating each of the plurality of second regions from the one or more third regions of the second layer.

4. The substrate of any one of clauses 1 through 3, wherein each of the plurality of second regions is surrounded by the intrinsic region in the second layer.

5. The substrate of any one of clauses 1 through 4, wherein a width of the plurality of second regions is greater than a width of the one or more third regions.

6. The substrate of any one of clauses 1 through 5, wherein the intrinsic layer is n-doped, wherein the intrinsic layer has a doping concentration lower than doping concentrations of the first region, the plurality of second regions, and the one or more third regions.

7. The substrate of any one of clauses 1 through 5, wherein the intrinsic layer is p-doped, wherein the intrinsic layer has a doping concentration lower than doping concentrations of the first region, the plurality of second regions, and the one or more third regions.

8. The substrate of any one of clauses 1 through 7, wherein:
the first region is coated with a first metal; and
the plurality of second regions and the one or more third regions are coated with a second metal.

9. The substrate of clause 8, wherein atomic number of the first metal is smaller than atomic number of the second metal.

10. The substrate of one of clauses 8 or 9, wherein the first metal is aluminum.

11. The substrate of any one of clauses 8 through 10, wherein the second metal is gold.

12. The substrate of any one of clauses 8 through 11, further comprising:
an insulating layer that is deposited on the second metal and that covers gaps between the plurality of second regions and the one or more third regions of the second layer.

13. The substrate of any one of clauses 1 through 12, further comprising:
a plurality of signal output lines connected to the plurality of second regions.

14. A substrate comprising:
a first layer including a first region of a first conductivity type;
a second layer that includes a plurality of second regions of a second conductivity type, wherein the plurality of second regions are partitioned from one another by a partition region; and
an intrinsic layer between the first layer and the second layer.
15. The substrate of clause 14, wherein the partition region includes an intrinsic region separating each of the plurality of second regions from one another.
16. The substrate of one of clauses 14 or 15, wherein the first conductivity type is n-type semiconductor and the second conductivity type is p-type semiconductor.
17. The substrate of one of clauses 15 or 16, wherein each of the plurality of second regions is surrounded by the intrinsic region in the second layer.
18. The substrate of any one of clauses 14 through 17, wherein the intrinsic layer is n-doped, wherein the intrinsic layer has a doping concentration lower than doping concentrations of the first region and the plurality of second regions.
19. The substrate of any one of clauses 14 through 18, wherein:
the first region is coated with a first metal; and
the plurality of second regions are coated with a second metal.
20. The substrate of clause 19, wherein the second metal includes a plurality of metal portions corresponding to each of the plurality of second regions.
21. The substrate of one of clauses 19 or 20, further comprising:
a plurality of signal output lines connected to the plurality of second regions via the second metal.
22. The substrate of any one of clauses 19 through 21, wherein atomic number of the second metal is smaller than atomic number of the first metal.
23. The substrate of any one of clauses 19 through 22, wherein the first metal is gold.
24. The substrate of any one of clauses 19 through 23, wherein the second metal is aluminum.
25. The substrate of clause 14, wherein the second layer further includes:
one or more third regions of the first conductivity type, wherein the plurality of second regions are partitioned from one another by the one or more third regions, and the plurality of second regions are spaced apart from the one or more third regions.
26. The substrate of one of clauses 14 or 25, wherein the first conductivity type is p-type semiconductor and the second conductivity type is n-type semiconductor.
27. An apparatus comprising:
a charged particle source configured to generate one or more charged particle beams;
a detector comprising:
a first layer including a first region of a first conductivity type,
a second layer including a plurality of second regions of a second conductivity type, wherein the plurality of second regions are partitioned from one another, and
an intrinsic layer between the first layer and the second layer,
wherein the plurality of second regions are configured to output electrical signals based on received charged particles; and
an amplifier configured to amplify the electrical signals outputted by the plurality of second regions and to forward the amplified electrical signals to a controller.
28. The apparatus of clause 27, wherein the second layer of the detector further includes:
one or more third regions of the first conductivity type, wherein the plurality of second regions are partitioned from one another by the one or more third regions, and the plurality of second regions are spaced apart from the one or more third regions.
29. The apparatus of one of clauses 27 and 28, wherein the first region in the first layer of the detector is configured to receive charged particles incident on a sensor surface of the detector.
30. The substrate of any one of clauses 27 through 29, wherein the first conductivity type is p-type semiconductor and the second conductivity type is n-type semiconductor.
31. The apparatus of clause 27, wherein the plurality of second regions in the second layer of the detector is configured to receive charged particles incident on a sensor surface of the detector.
32. The apparatus of one of clauses 27 or 31, wherein the first conductivity type is n-type semiconductor and the second conductivity type is p-type semiconductor.
33. A method comprising:
applying a first bias to a first region of a first conductivity type of a first layer of a detector and second bias to a plurality of second regions of a second conductivity type of a second layer of the detector, the detector including an intrinsic region between the first layer and the second layer, wherein the plurality of second regions are partitioned from one another by a partition region;
receiving an output signal from the second layer; and
determining a charged particle signal based on the received output signal.
34. The method of clause 33, further comprising adjusting at least one of the first bias or the second bias.
35. The method of one of clauses 33 or 34, wherein applying the first bias and the second bias comprises forward biasing.
36. The method of one of clauses 33 or 34, wherein applying the first bias and the second bias comprises reverse biasing.
37. The method of any one of clauses 33 through 36, wherein the partition region includes an intrinsic region separating each of the plurality of second regions from one another.
38. The method of any one of clauses 33 through 37, wherein the first conductivity type is n-type semiconductor and the second conductivity type is p-type semiconductor.
39. The method of any one of clauses 33 through 38, wherein the intrinsic layer is n-doped, wherein the intrinsic layer has a doping concentration lower than doping concentrations of the first region and the plurality of second regions.
40. The method of clause 33, wherein the second layer further includes:
one or more third regions of the first conductivity type, wherein the plurality of second regions are partitioned from one another by the one or more third regions, and the plurality of second regions are spaced apart from the one or more third regions.
41. The method of one of clauses 33 or 40, wherein the first conductivity type is p-type semiconductor and the second conductivity type is n-type semiconductor.

The block diagrams in the figures illustrate the architecture, functionality, and operation of possible implementations of systems, methods, and computer hardware/software products according to various exemplary embodiments of the present disclosure. In this regard, each block in a schematic diagram may represent certain arithmetical or logical operation processing that may be implemented using hardware such as an electronic circuit. Blocks may also represent a module, segment, or portion of code that comprises one or more executable instructions for implementing the specified logical functions. It should be understood that in some alternative implementations, functions indicated in a block may occur out of the order noted in the figures. For example, two blocks shown in succession may be executed or implemented substantially concurrently, or two blocks may sometimes be executed in reverse order, depending upon the functionality involved. Some blocks may also be omitted. It should also be understood that each block of the block diagrams, and combination of the blocks, may be implemented by special purpose hardware-based systems that perform the specified functions or acts, or by combinations of special purpose hardware and computer instructions.

It will be appreciated that the embodiments of the present disclosure are not limited to the exact construction that has been described above and illustrated in the accompanying drawings, and that various modifications and changes can be made without departing from the scope thereof. For example, while some embodiments have been discussed in the context of multi-beam apparatuses, a multi-cell detector may be similarly applied to a single-beam apparatus wherein a plurality of beams may be generated from a single beam striking a sample.

What is claimed is:

1. A substrate comprising:
a first layer including a first region of a first conductivity type, wherein the first conductivity type is p-type semiconductor;
a second layer that includes a plurality of second regions of a second conductivity type and one or more third regions of the first conductivity type, wherein the second conductivity type is n-type semiconductor, and the plurality of second regions are partitioned from one another by the one or more third regions; and
an intrinsic layer between the first layer and the second layer, wherein the first layer is configured to receive a plurality of secondary electron beams generated from a sample surface.

2. The substrate of claim 1, wherein the plurality of second regions are spaced apart from the one or more third regions.

3. The substrate of claim 1, wherein the second layer further includes an intrinsic region separating each of the plurality of second regions from the one or more third regions of the second layer.

4. The substrate of claim 1, wherein each of the plurality of second regions is surrounded by the intrinsic region in the second layer.

5. The substrate of claim 1, wherein a width of the plurality of second regions is greater than a width of the one or more third regions.

6. The substrate of claim 1, wherein the intrinsic layer is n-doped, wherein the intrinsic layer has a doping concentration lower than doping concentrations of the first region, the plurality of second regions, and the one or more third regions.

7. The substrate of claim 1, wherein the intrinsic layer is p-doped, wherein the intrinsic layer has a doping concentration lower than doping concentrations of the first region, the plurality of second regions, and the one or more third regions.

8. The substrate of claim 1, wherein:
the first region is coated with a first metal; and
the plurality of second regions and the one or more third regions are coated with a second metal.

9. The substrate of claim 8, wherein atomic number of the first metal is smaller than atomic number of the second metal.

10. The substrate of claim 8, wherein the first metal is aluminum.

11. The substrate of claim 8, wherein the second metal is gold.

12. The substrate of claim 8, further comprising:
an insulating layer that is deposited on the second metal and that covers gaps between the plurality of second regions and the one or more third regions of the second layer.

13. The substrate of claim 1, further comprising:
a plurality of signal output lines connected to the plurality of second regions.

14. An apparatus comprising:
a charged particle source configured to generate one or more charged particle beams;
a detector comprising:
a first layer including a first region of a first conductivity type, wherein the first conductivity type is p-type semiconductor,
a second layer including a plurality of second regions of a second conductivity type, wherein the second conductivity type is n-type semiconductor, and wherein the plurality of second regions are partitioned from one another, and
an intrinsic layer between the first layer and the second layer,
wherein the plurality of second regions are configured to output electrical signals based on received charged particles, and wherein the first layer is configured to receive a plurality of secondary electron beams generated from a sample surface; and
an amplifier configured to amplify the electrical signals outputted by the plurality of second regions and to forward the amplified electrical signals to a controller.

15. A method comprising:
applying a first bias to a first region of a first conductivity type of a first layer of a detector and second bias to a plurality of second regions of a second conductivity type of a second layer of the detector, the detector including an intrinsic region between the first layer and the second layer, wherein the first conductivity type is p-type semiconductor and the second conductivity type is n-type semiconductor, wherein the plurality of second regions are partitioned from one another by a partition region, and wherein the first layer is configured to receive a plurality of secondary electron beams generated from a sample surface;
receiving an output signal from the second layer; and
determining a charged particle signal based on the received output signal.

* * * * *